US006800506B1

(12) United States Patent
Lin et al.

(10) Patent No.: US 6,800,506 B1
(45) Date of Patent: *Oct. 5, 2004

(54) METHOD OF MAKING A BUMPED TERMINAL IN A LAMINATED STRUCTURE FOR A SEMICONDUCTOR CHIP ASSEMBLY

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 309 days.

This patent is subject to a terminal disclaimer.

(21) Appl. No.: 10/156,469

(22) Filed: May 28, 2002

Related U.S. Application Data

(63) Continuation of application No. 09/972,796, filed on Oct. 6, 2001, now Pat. No. 6,667,229, and a continuation-in-part of application No. 09/962,754, filed on Sep. 24, 2001, now Pat. No. 6,673,710, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835, said application No. 09/972,796, is a continuation-in-part of application No. 09/917,339, filed on Jul. 27, 2001, now Pat. No. 6,537,851.

(51) Int. Cl.⁷ .......................... H01L 21/44; H01L 21/48; H01L 21/50

(52) U.S. Cl. ..................... 438/107; 438/105; 438/106; 438/108

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |

(List continued on next page.)

FOREIGN PATENT DOCUMENTS

| | | |
|---|---|---|
| EP | 0 718 882 A1 | 6/1996 |
| WO | WO 97/38563 | 10/1997 |
| WO | WO 99/57762 | 11/1999 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Ghaffarian, "Long Time BGA Assembly Reliability," Advancing Microelectronics, vol. 25, No. 6, Sep./Oct. 1998, pp. 20–23.

(List continued on next page.)

*Primary Examiner*—David Nelms
*Assistant Examiner*—Renee R. Berry
(74) *Attorney, Agent, or Firm*—David M. Sigmond

(57) ABSTRACT

A method of making a semiconductor chip assembly includes providing a semiconductor chip and a laminated structure, wherein the chip includes a conductive pad, the laminated structure includes a conductive trace, an insulative base and a metal base, the conductive trace includes a routing line and a bumped terminal, the metal base and the routing line are disposed on opposite sides of the insulative base, and the bumped terminal includes a cavity that extends through the insulative base and into the metal base, removing a portion of the metal base that contacts the bumped terminal, and forming a connection joint that contacts and electrically connects the conductive trace and the pad.

100 Claims, 24 Drawing Sheets

U.S. PATENT DOCUMENTS

| | | |
|---|---|---|
| 5,014,111 A | 5/1991 | Tsuda et al. .................. 357/68 |
| 5,060,843 A | 10/1991 | Yasuzato et al. ............ 228/179 |
| 5,074,947 A | 12/1991 | Estes et al. ............. 156/307.3 |
| 5,090,119 A | 2/1992 | Tsuda et al. .................. 29/843 |
| 5,106,461 A | 4/1992 | Volfson et al. ............. 205/125 |
| 5,116,463 A | 5/1992 | Lin et al. .................... 156/653 |
| 5,137,845 A | 8/1992 | Lochon et al. .............. 437/183 |
| 5,167,992 A | 12/1992 | Lin et al. .................... 427/437 |
| 5,172,851 A | 12/1992 | Matsushita et al. ......... 228/179 |
| 5,196,371 A | 3/1993 | Kulesza et al. ............. 437/183 |
| 5,209,817 A | 5/1993 | Ahmad et al. .............. 156/643 |
| 5,261,593 A | 11/1993 | Casson et al. ......... 228/180.22 |
| 5,275,330 A | 1/1994 | Issacs et al. ............. 228/180.2 |
| 5,284,796 A | 2/1994 | Nakanishi et al. .......... 437/183 |
| 5,293,067 A | 3/1994 | Thompson et al. ......... 257/668 |
| 5,294,038 A | 3/1994 | Nakano et al. .......... 228/179.1 |
| 5,327,010 A | 7/1994 | Uenaka et al. .............. 257/679 |
| 5,334,804 A | 8/1994 | Love et al. ................. 174/267 |
| 5,346,750 A | 9/1994 | Hatakeyama et al. ....... 428/209 |
| 5,355,283 A | 10/1994 | Marrs et al. ................. 361/760 |
| 5,358,621 A | 10/1994 | Oyama ....................... 205/123 |
| 5,364,004 A | 11/1994 | Davidson .................... 228/1.1 |
| 5,397,921 A | 3/1995 | Karnezos .................... 257/779 |
| 5,407,864 A | 4/1995 | Kim ........................... 437/203 |
| 5,424,245 A | 6/1995 | Gurtler et al. ............... 437/183 |
| 5,438,477 A | 8/1995 | Pasch ......................... 361/689 |
| 5,439,162 A | 8/1995 | George et al. ......... 228/180.22 |
| 5,447,886 A | 9/1995 | Rai ............................. 437/183 |
| 5,454,161 A | 10/1995 | Beilin et al. .................. 29/852 |
| 5,454,928 A | 10/1995 | Rogers et al. ............. 205/125 |
| 5,475,236 A | 12/1995 | Yoshizaki .................... 257/48 |
| 5,477,933 A | 12/1995 | Nguyen ...................... 174/262 |
| 5,478,007 A | 12/1995 | Marrs .................... 228/180.22 |
| 5,483,421 A | 1/1996 | Gedney et al. ............. 361/771 |
| 5,484,647 A | 1/1996 | Nakatani et al. ............ 428/209 |
| 5,485,949 A | 1/1996 | Tomura et al. .......... 228/180.5 |
| 5,487,218 A | 1/1996 | Bhatt et al. ................... 29/852 |
| 5,489,804 A | 2/1996 | Pasch ......................... 257/778 |
| 5,493,096 A | 2/1996 | Koh ...................... 219/121.71 |
| 5,508,229 A | 4/1996 | Baker ......................... 437/183 |
| 5,525,065 A | 6/1996 | Sobhani ....................... 439/67 |
| 5,536,973 A | 7/1996 | Yamaji ....................... 257/737 |
| 5,542,601 A | 8/1996 | Fallon et al. ................ 228/119 |
| 5,547,740 A | 8/1996 | Higdon et al. .............. 428/209 |
| 5,556,810 A | 9/1996 | Fujitsu ........................ 437/209 |
| 5,556,814 A | 9/1996 | Inoue et al. ................. 437/230 |
| 5,564,181 A | 10/1996 | Dineen et al. ................ 29/841 |
| 5,572,069 A | 11/1996 | Schneider ................... 257/690 |
| 5,576,052 A | 11/1996 | Arledge et al. ............... 427/98 |
| 5,583,073 A | 12/1996 | Lin et al. .................... 439/183 |
| 5,595,943 A | 1/1997 | Itabashi et al. ............. 437/230 |
| 5,599,744 A | 2/1997 | Koh et al. ................... 437/195 |
| 5,611,140 A | 3/1997 | Kulesza et al. ............... 29/832 |
| 5,611,884 A | 3/1997 | Bearinger et al. ........... 156/325 |
| 5,613,296 A | 3/1997 | Kurino et al. ................ 29/852 |
| 5,614,114 A | 3/1997 | Owen .................... 219/121.66 |
| 5,615,477 A | 4/1997 | Sweitzer ...................... 29/840 |
| 5,619,791 A | 4/1997 | Lambrecht, Jr. et al. ...... 29/852 |
| 5,627,405 A | 5/1997 | Chillara ...................... 257/668 |
| 5,627,406 A | 5/1997 | Pace ........................... 257/700 |
| 5,633,204 A | 5/1997 | Tago et al. .................. 438/614 |
| 5,637,920 A | 6/1997 | Loo ............................ 257/700 |
| 5,641,113 A | 6/1997 | Somaki et al. ......... 228/180.22 |
| 5,645,628 A | 7/1997 | Endo et al. ................. 106/1.23 |
| 5,646,067 A | 7/1997 | Gaul ........................... 437/180 |
| 5,648,686 A | 7/1997 | Hirano et al. ............... 257/778 |
| 5,654,584 A | 8/1997 | Fujitsu ........................ 257/666 |
| 5,656,858 A | 8/1997 | Kondo et al. ............... 257/737 |
| 5,663,598 A | 9/1997 | Lake et al. .................. 257/737 |
| 5,665,652 A | 9/1997 | Shimizu ...................... 438/127 |
| 5,666,008 A | 9/1997 | Tomita et al. ............... 257/778 |
| 5,669,545 A | 9/1997 | Pham et al. .................. 228/1.1 |
| 5,674,785 A | 10/1997 | Akram et al. ............... 437/217 |
| 5,674,787 A | 10/1997 | Zhao et al. .................. 437/230 |
| 5,682,061 A | 10/1997 | Khandros et al. ........... 257/666 |
| 5,686,353 A | 11/1997 | Yagi et al. ................... 437/183 |
| 5,691,041 A | 11/1997 | Frankeny et al. ........... 428/209 |
| 5,722,162 A | 3/1998 | Chou et al. ................... 29/852 |
| 5,723,369 A | 3/1998 | Barber ........................ 438/106 |
| 5,731,223 A | 3/1998 | Padmanabhan ............. 437/183 |
| 5,736,456 A | 4/1998 | Akram ........................ 438/614 |
| 5,739,585 A | 4/1998 | Akram et al. ............... 257/698 |
| 5,744,859 A | 4/1998 | Ouchida ...................... 257/668 |
| 5,757,071 A | 5/1998 | Bhansali ...................... 257/697 |
| 5,757,081 A | 5/1998 | Chang et al. ................ 257/778 |
| 5,764,486 A | 6/1998 | Pendse ........................ 361/774 |
| 5,774,340 A | 6/1998 | Chang et al. ................ 361/771 |
| 5,789,271 A | 8/1998 | Akram .......................... 438/18 |
| 5,798,285 A | 8/1998 | Bentlage et al. ............. 438/108 |
| 5,801,072 A | 9/1998 | Barber ........................ 438/107 |
| 5,801,447 A | 9/1998 | Hirano et al. ............... 257/778 |
| 5,803,340 A | 9/1998 | Yeh et al. ................... 228/56.3 |
| 5,804,771 A | 9/1998 | McMahon et al. .......... 174/255 |
| 5,808,360 A | 9/1998 | Akram ........................ 257/738 |
| 5,811,879 A | 9/1998 | Akram ........................ 257/723 |
| 5,813,115 A | 9/1998 | Misawa et al. ............... 29/832 |
| 5,817,541 A | 10/1998 | Averkiou et al. ............ 438/107 |
| 5,822,856 A | 10/1998 | Bhatt et al. ................... 29/832 |
| 5,834,844 A | 11/1998 | Akagawa et al. ............ 257/734 |
| 5,861,666 A | 1/1999 | Bellaar ........................ 257/686 |
| 5,863,816 A | 1/1999 | Cho ............................ 438/123 |
| 5,870,289 A | 2/1999 | Tokuda et al. ............... 361/779 |
| 5,883,435 A | 3/1999 | Geffken et al. .............. 257/758 |
| 5,925,931 A | 7/1999 | Yamamoto ................... 257/737 |
| 5,994,222 A | 11/1999 | Smith et al. ................. 438/689 |
| 6,012,224 A | 1/2000 | DiStefano et al. ............. 29/840 |
| 6,013,877 A | 1/2000 | Degani et al. ............... 174/264 |
| 6,017,812 A | 1/2000 | Yonezawa et al. ........... 438/613 |
| 6,018,196 A | 1/2000 | Noddin ....................... 257/777 |
| 6,020,561 A | 2/2000 | Ishida et al. ................. 174/261 |
| 6,037,665 A | 3/2000 | Miyazaki .................... 257/773 |
| 6,046,909 A | 4/2000 | Joy ............................. 361/748 |
| 6,084,297 A | 7/2000 | Brooks et al. ............... 257/698 |
| 6,084,781 A | 7/2000 | Klein .......................... 361/771 |
| 6,088,236 A | 7/2000 | Tomura et al. .............. 361/783 |
| 6,103,552 A | 8/2000 | Lin ............................. 438/113 |
| 6,103,992 A | 8/2000 | Noddin .................. 219/121.71 |
| 6,127,204 A | 10/2000 | Isaacs et al. ................. 438/106 |
| 6,159,770 A | 12/2000 | Tetaka et al. ................ 438/112 |

OTHER PUBLICATIONS

U.S. Application Ser. No. 09/465,024, filed Dec. 16, 1999, entitled "Bumpless Flip Chip Assembly With Solder Via".

U.S. Application Ser. No. 09/464,562, filed Dec. 16, 1999, entitled "Bumpless Flip Chip Assembly With Strips And Via–Fill".

U.S. Application Ser. No. 09/464,561, filed Dec. 16, 1999, entitled "Bumpless Flip Chip Assembly With Strips–In–Via And Plating".

U.S. Application Ser. No. 09/120,408, filed Jul. 22, 1998, entitled "Flip Chip Assembly With Via Interconnection".

U.S. Application Ser. No. 09/643,212, filed Aug. 22, 2000, entitled "Semiconductor Chip Assembly With Simultaneously Electroplated Contact Terminal and Connection Joint".

U.S. Application Ser. No. 09/643,214, filed Aug. 22, 2000, entitled "Semiconductor Chip Assembly with Simultaneously Electrolessly Plated Contact Terminal and Connection Joint".

U.S. Application Ser. No. 09/643,213, filed Aug. 22, 2000, entitled "Method Of Making A Support Circuit For A Semiconductor Chip Assembly".

U.S. Application Ser. No. 09/643,445, filed Aug. 22, 2000, entitled "Method Of Making A Semiconductor Chip Assembly".

U.S. Application Ser. No. 09/665,928, filed Sep. 20, 2000, entitled "Semiconductor Chip Assembly With Ball Bond Connection Joint".

U.S. Application Ser. No. 09/665,931, filed Sep. 20, 2000, entitled "Method Of Making A Support Circuit With A Tapered Through–Hole For A Semiconductor Chip Assembly".

U.S. Application Ser. No. 09/677,207, filed Oct. 2, 2000, entitled "Method Of Making A Semiconductor Chip Assembly With A Conductive Trace Subtractively Formed Before And After Chip Attachment".

U.S. Application Ser. No. 09/865,367, filed May 24, 2001, entitled "Semiconductor Chip Assembly With Simultaneously Electroplated Contact Terminal and Connection Joint".

U.S. Application Ser. No. 09/864,555, filed May 24, 2001, entitled "Semiconductor Chip Assembly with Simultaneously Electrolessly Plated Contact Terminal and Connection Joint".

U.S. Application Ser. No. 09/864,773, filed May 24, 2001, entitled "Semiconductor Chip Assembly With Ball Bond Connection Joint".-

METHOD OF MAKING A BUMPED TERMINAL IN A LAMINATED STRUCTURE FOR A SEMICONDUCTOR CHIP ASSEMBLY

CROSS-REFERENCE TO RELATED APPLICATIONS

This application is a continuation of U.S. application Ser. No. 09/972,796 filed Oct. 6, 2001, now U.S. Pat. No. 6,667,229.

The '796 application is a continuation-in-part of U.S. application Ser. No. 09/962,754 filed Sep. 24, 2001, now U.S. Pat. No. 6,673,710, which is a continuation-in-part of U.S. application Ser. No. 09/878,626 filed Jun. 11, 2001 now U.S. Pat. No. 6,653,217, which is a continuation-in-part of U.S. application Ser. No. 09/687,619 filed Oct. 13, 2000 now U.S. Pat. No. 6,440,235, each of which is incorporated by reference.

The '796 application is also a continuation-in-part of U.S. application Ser. No. 09/917,339 filed Jul. 27, 2001 now U.S. Pat. No. 6,537,851, which is a continuation-in-part of U.S. application Ser. No. 09/878,626 filed Jun. 11, 2001 now U.S. Pat. No. 6,653,217, which is a continuation-in-part of U.S. application Ser. No. 09/687,619 filed Oct. 13, 2000 now U.S. Pat. No. 6,440,835, each of which is incorporated by reference.

BACKGROUND OF THE INVENTION

1. Field of the Invention

The present invention relates to a semiconductor chip assembly, and more particularly to a method of connecting a conductive trace and an insulative base to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is detective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder Joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initlate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a Jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, and provides excellent mechanical and electrical performance.

SUMMARY OF THE INVENTION

An object of the present invention is to provide a semiconductor chip assembly with a chip, a conductive trace and an insulative base that provides a low cost, high performance, high reliability package.

Another object of the present invention is to provide a convenient, cost-effective method for manufacturing semiconductor chip assemblies as grid arrays or other structures.

In accordance with an aspect of the invention, a method of making a semiconductor chip assembly includes providing a semiconductor chip and a laminated structure, wherein the chip includes a conductive pad, the laminated structure includes a conductive trace, an insulative base and a metal base, the conductive trace includes a routing line and a bumped terminal, the metal base and the routing line are disposed on opposite sides of the insulative base, and the bumped terminal includes a cavity that extends through the insulative base and into the metal base, removing a portion of the metal base that contacts the bumped terminal, and forming a connection joint that contacts and electrically connects the conductive trace and the pad.

The method may include mechanically attaching the chip to the conductive trace using an insulative adhesive, and then forming a through-hole through the insulative base and the adhesive that exposes the routing line and the pad.

The method may include mechanically attaching the chip to the conductive trace using an insulative adhesive, and then forming the through-hole through the insulative base and the adhesive.

The method may also include providing a laminated structure that includes the conductive trace, the insulative base and a metal base, mechanically attaching the chip to the laminated structure using the adhesive such that the metal base is disposed on a side of the insulative base that faces away from the chip and the conductive trace extends to a side of the insulative base that faces towards the chip, etching the metal base, and then forming the through-hole.

The method may also include providing the conductive trace with a routing line and the bumped terminal, wherein the routing line is disposed on a side of the insulative base that faces towards the chip and overlaps the pad, and the bumped terminal contacts the routing line and extends through the insulative base.

The method may also include forming a via that extends through a metal layer and the insulative base and into but not through the metal base, and depositing the bumped terminal into the via.

The method may also include depositing a first portion of the bumped terminal into the via and on the metal base but not on the insulative base or the metal layer, then depositing a second portion of the bumped terminal into the via and on the first portion of the bumped terminal and the insulative base and the metal layer, thereby plating the via sidewalls. Preferably, the first portion of the bumped terminal is deposited by electroplating, and the second portion of the bumped terminal is deposited by electroless plating followed by electroplating.

The method may also include forming a photoresist layer over the metal layer, etching the metal layer using the photoresist layer as an etch mask such that an unetched portion of the metal layer forms at least a portion of the routing line, and then removing the photoresist layer.

The method may also include forming the photoresist layer, etching the metal layer and removing the photoresist layer after forming the bumped terminal.

The method may also include positioning the conductive trace and the chip such that the routing line extends outside a periphery of the pad and the bumped terminal is disposed outside the periphery of the pad and inside a periphery of the chip, and filling the adhesive into the cavity.

The method may also include positioning the conductive trace and the chip such that the routing line extends within and outside a periphery of the chip and the bumped terminal is disposed outside the periphery of the chip, and forming an encapsulant on a side of the chip opposite the pad that fills the cavity after attaching the chip to the conductive trace and before etching the metal base. Preferably, the encapsulant is compressible and permits the bumped terminal to exhibit elastic deformation in response to externally applied pressure.

An advantage of the present invention is that the semiconductor chip assembly includes a conductive trace with an additively formed bumped terminal that includes a cavity, and the cavity can be filled with a compressible material, thereby permitting the bumped terminal to exhibit compliance for the next level assembly. Another advantage is that the insulative base can be provided before the metal base is etched, thereby enhancing the mechanical support and protection for the conductive trace when the metal base is etched. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
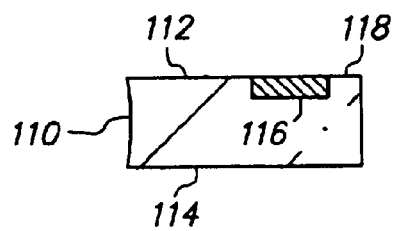
FIGS. 1A–1P are cross-sectional views showing a method of making a semiconductor chip assembly in accordance with an embodiment of the present invention.
Figure 2A:
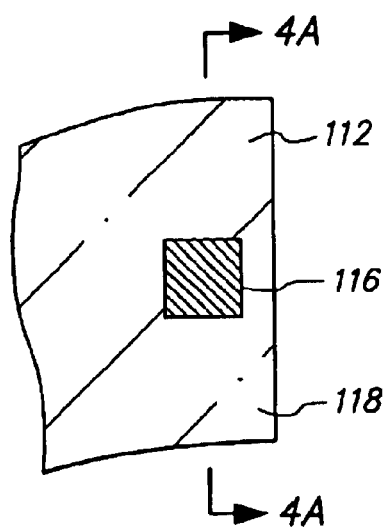
FIGS. 2A–2P are top plan views corresponding to FIGS. 1A–1P, respectively.
Figure 3A:
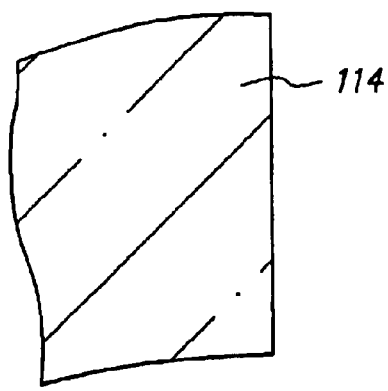
FIGS. 3A–3P are bottom plan views corresponding to FIGS. 1A–1P, respectively.
Figure 1B:
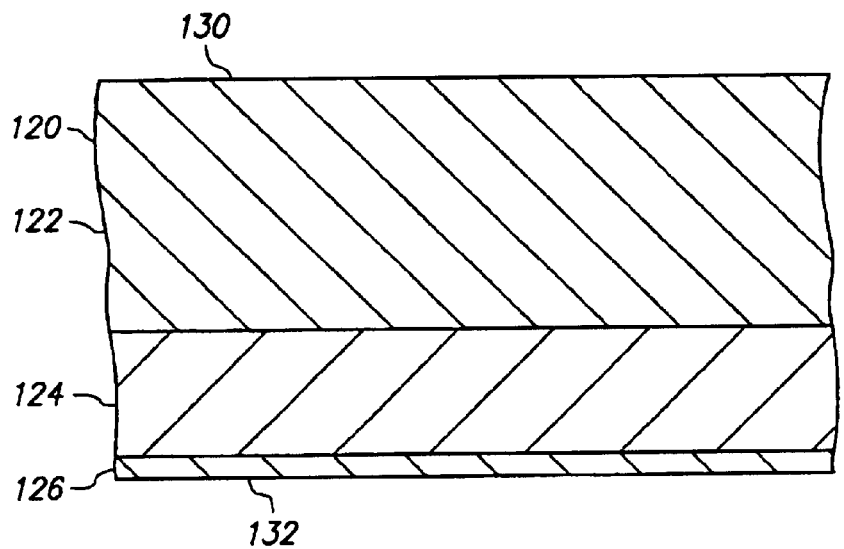
Figure 2B:
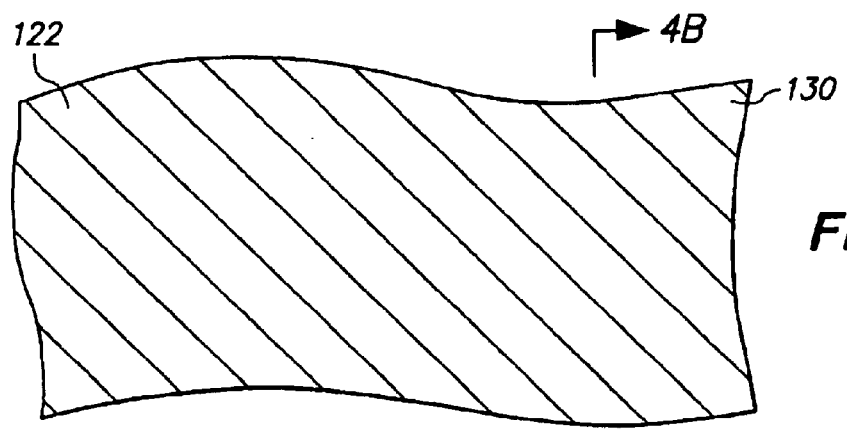
Figure 3B:
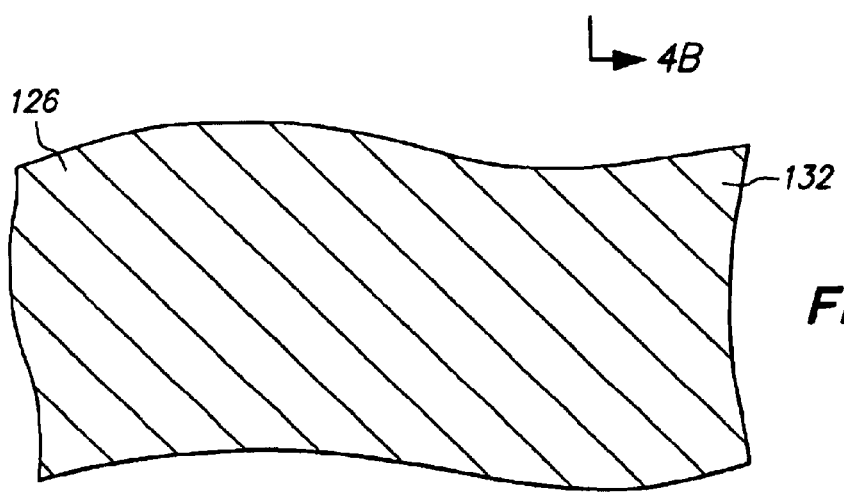
Figure 1C:
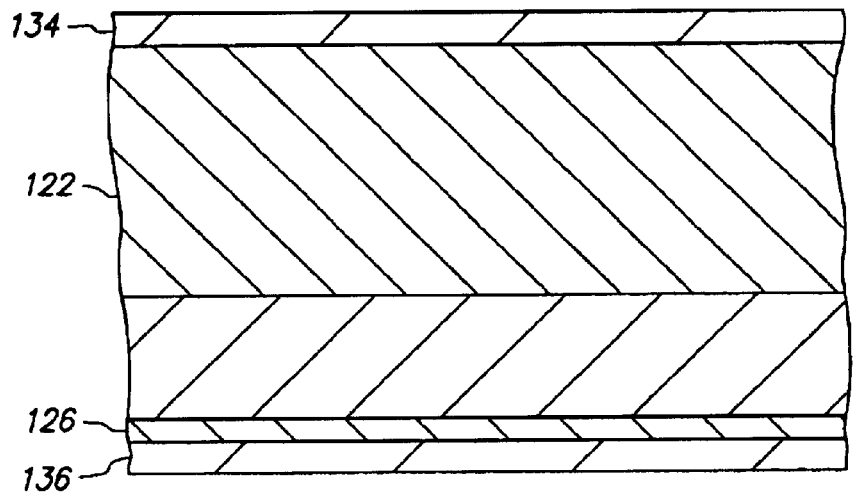
Figure 2C:
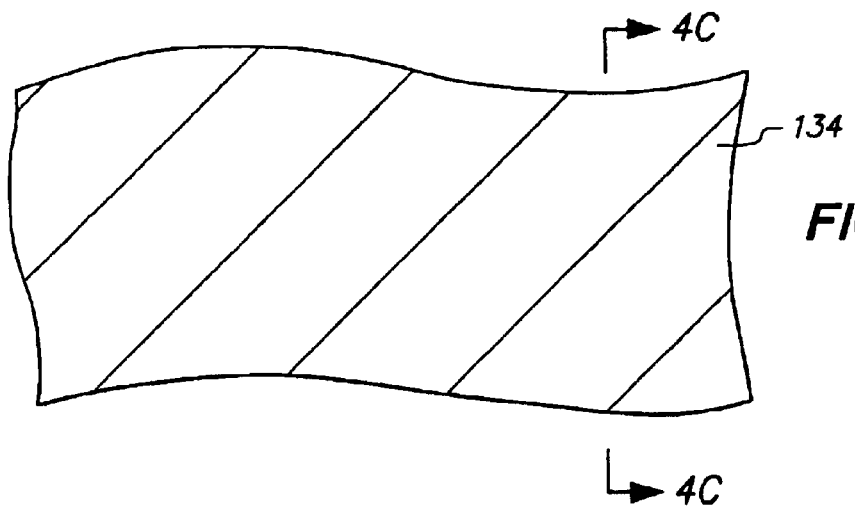
Figure 3C:
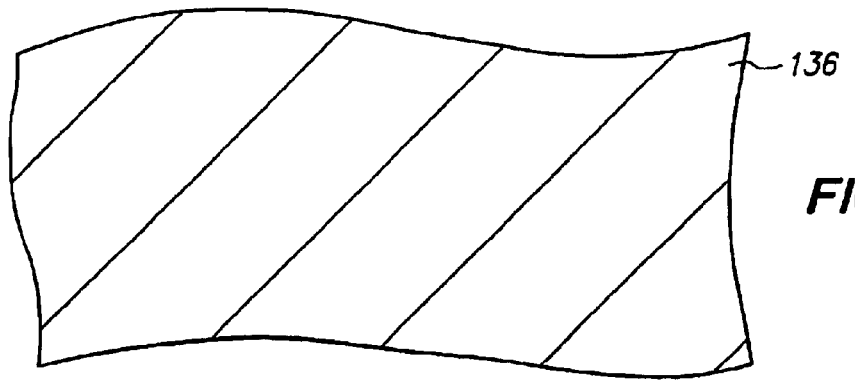
Figure 1D:
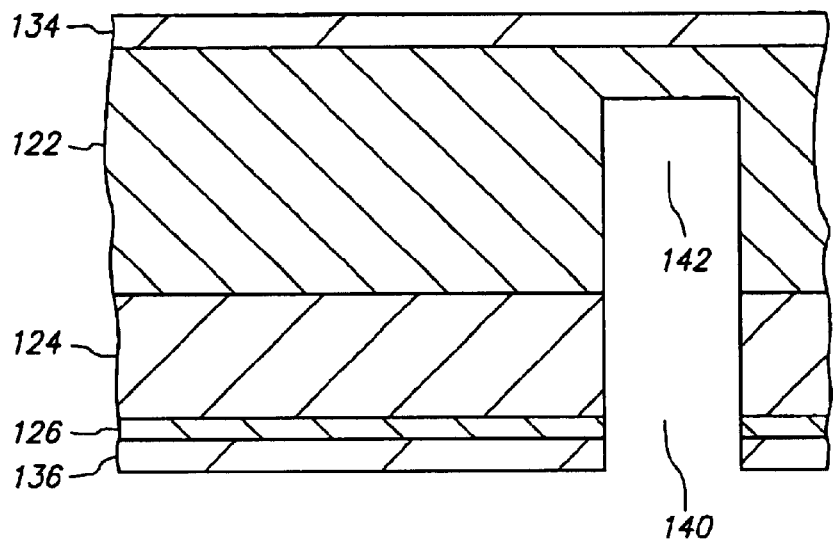
Figure 2D:
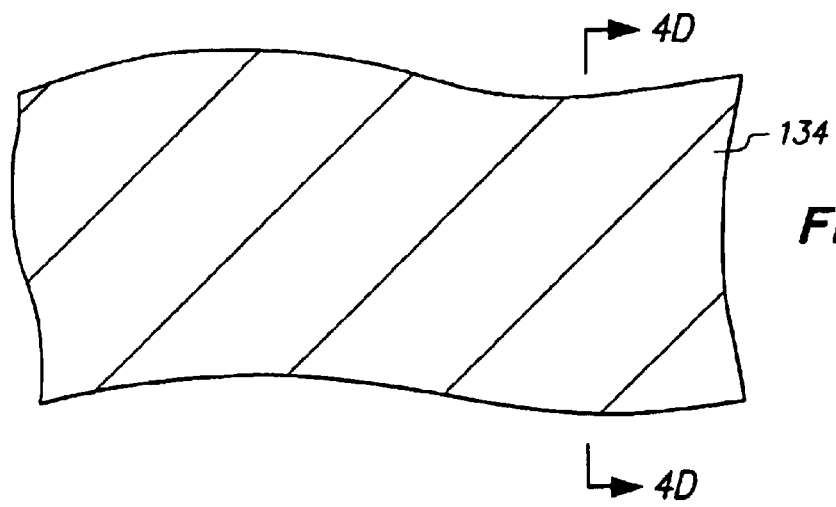
Figure 3D:
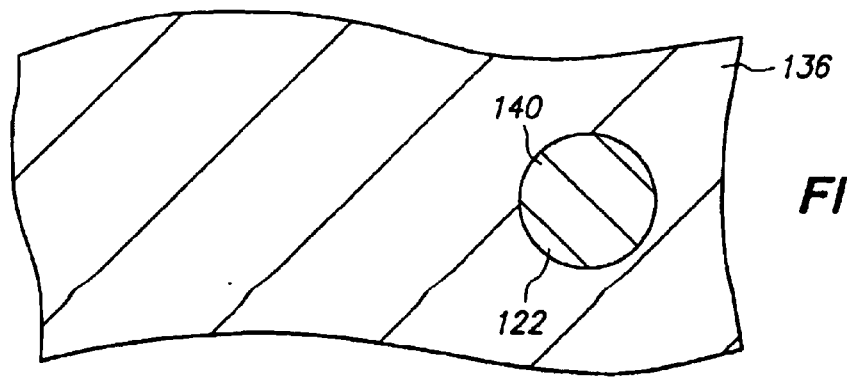
Figure 1E:
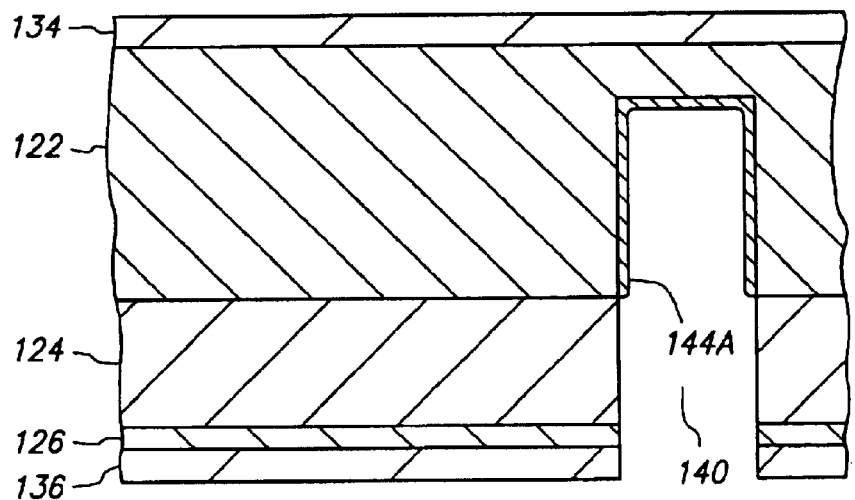
Figure 2E:
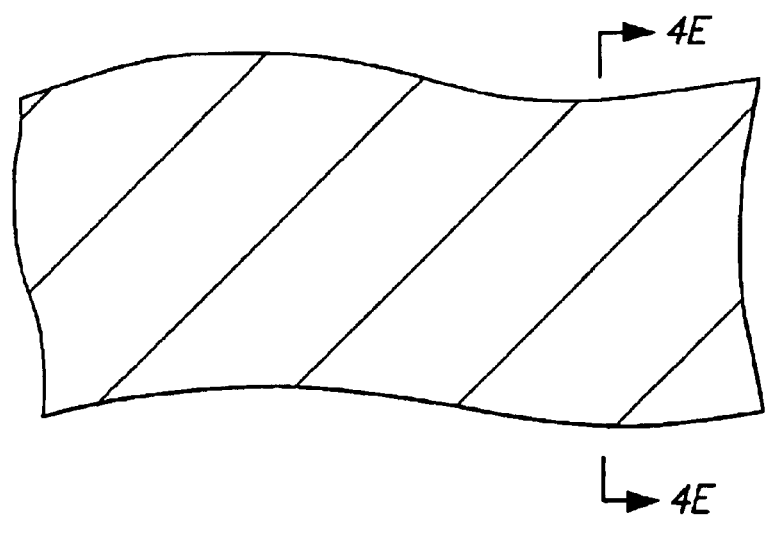
Figure 3E:
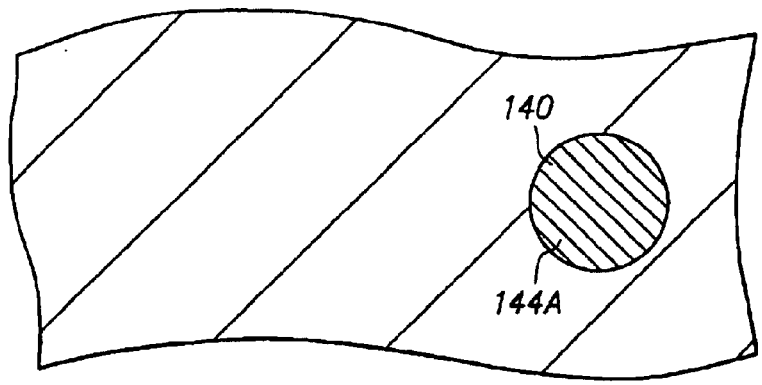
Figure 1F:
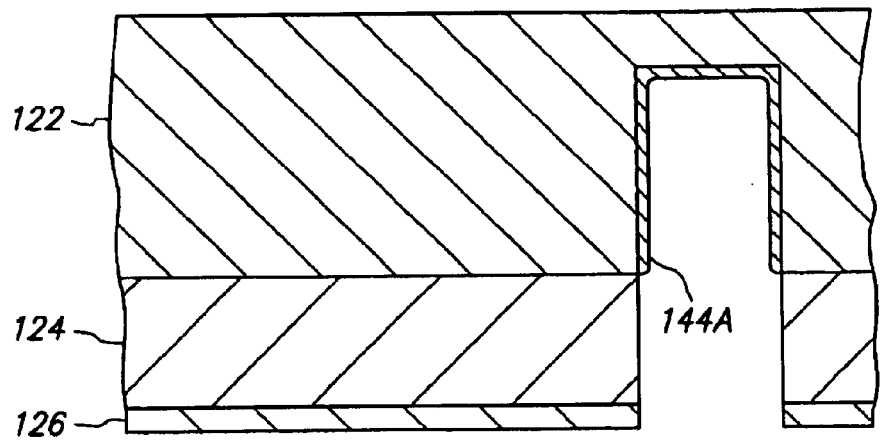
Figure 2F:
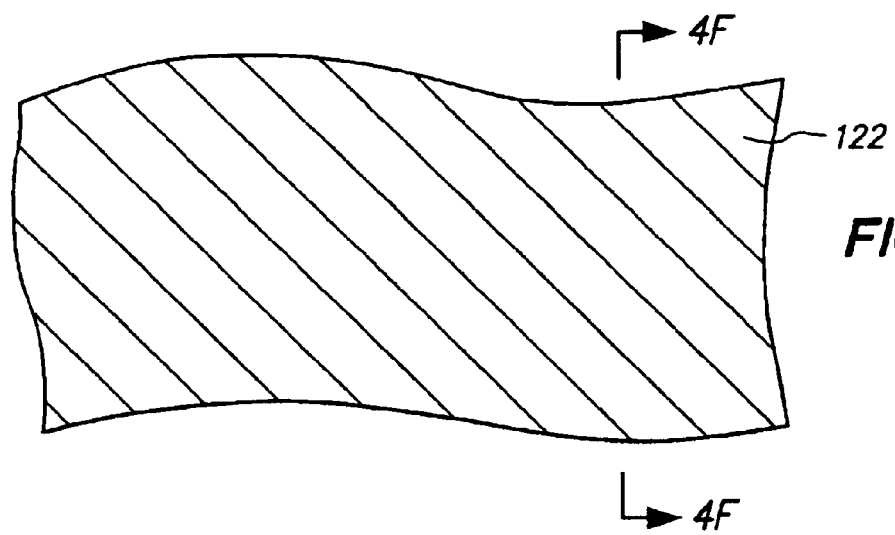
Figure 3F:
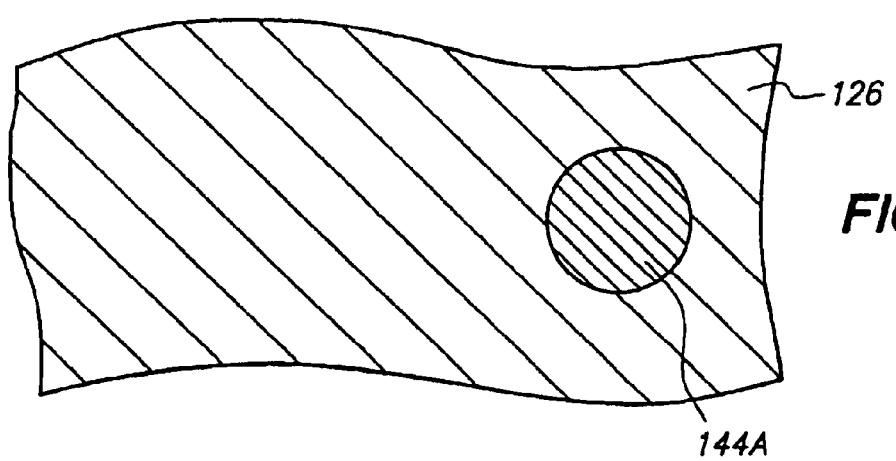
Figure 1G:
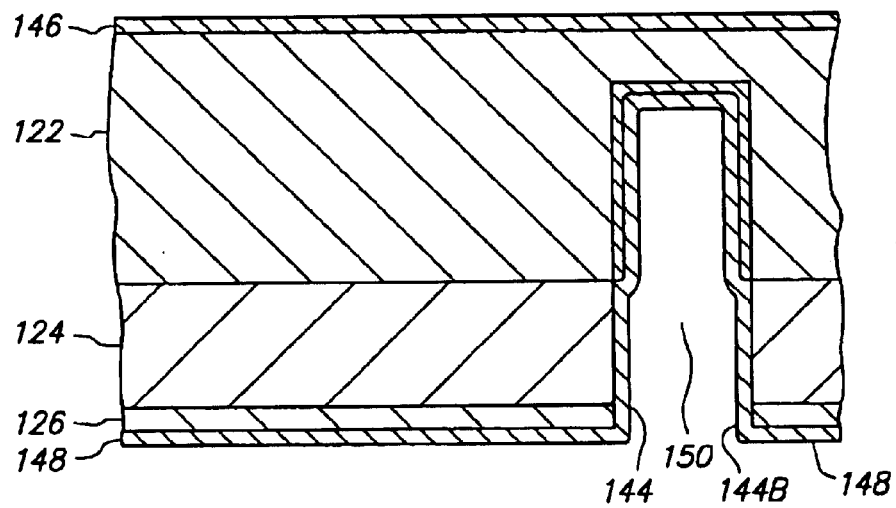
Figure 2G:
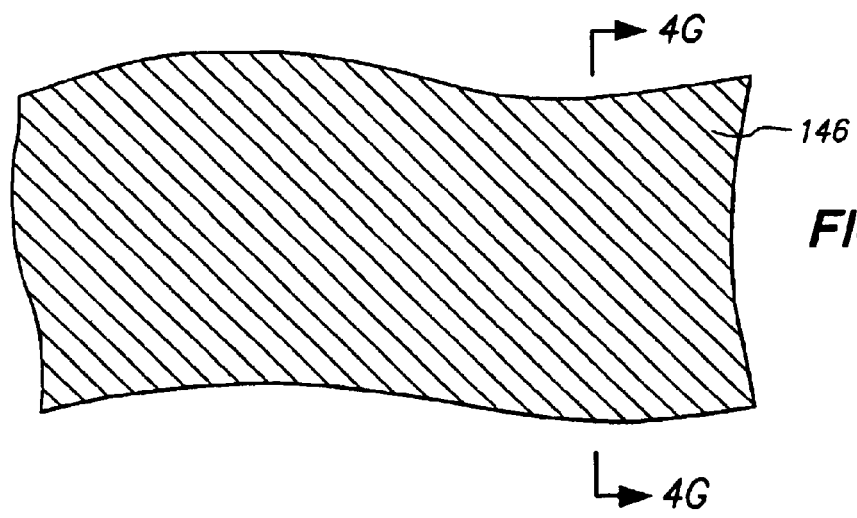
Figure 3G:
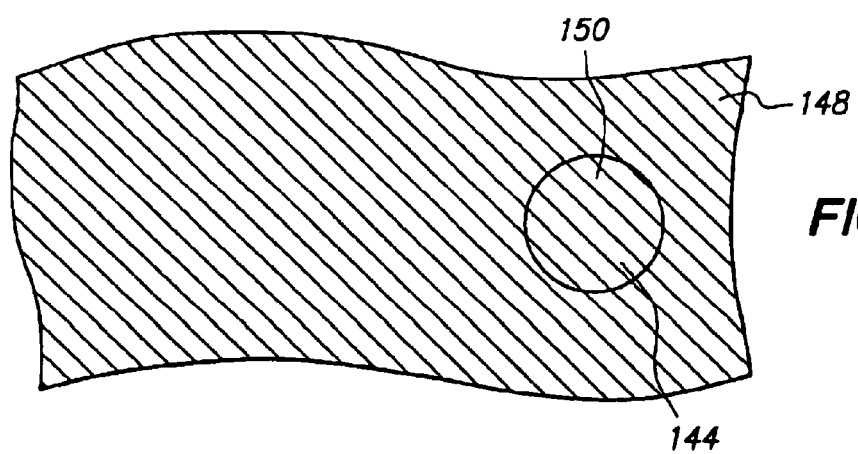
Figure 1H:
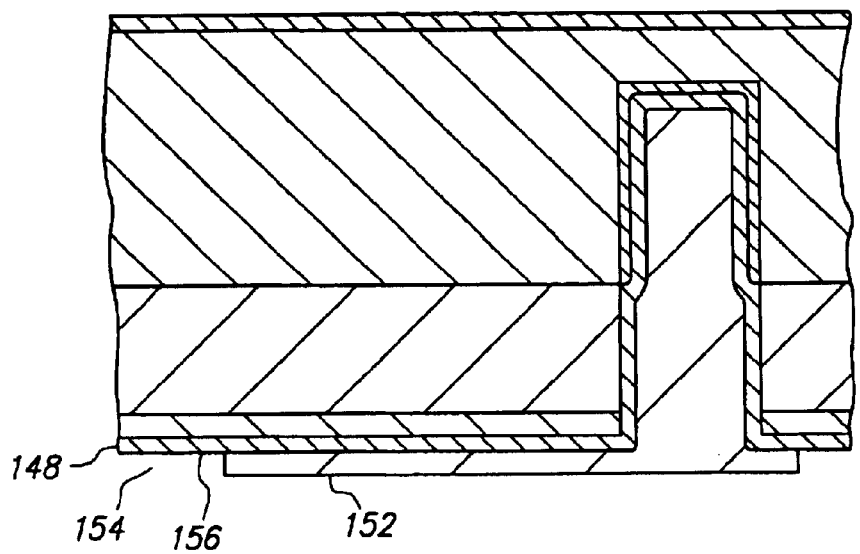
Figure 2H:
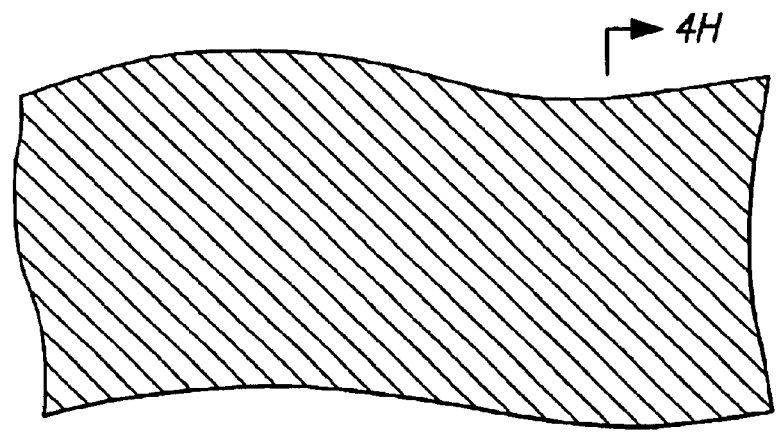
Figure 3H:
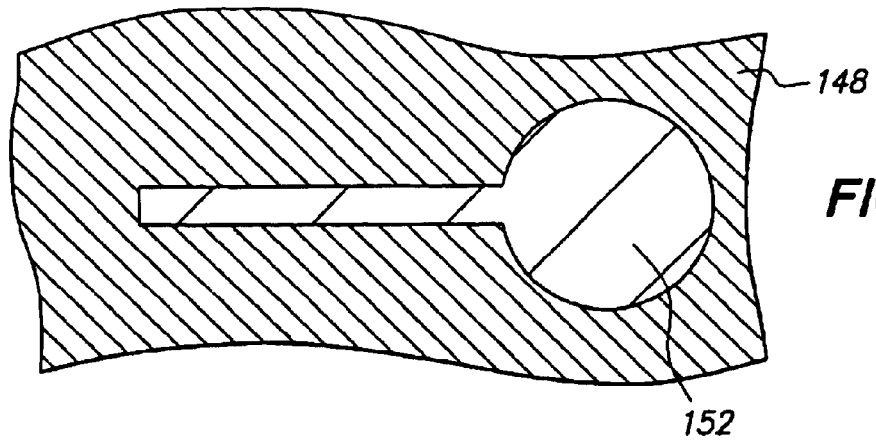
Figure 1L:
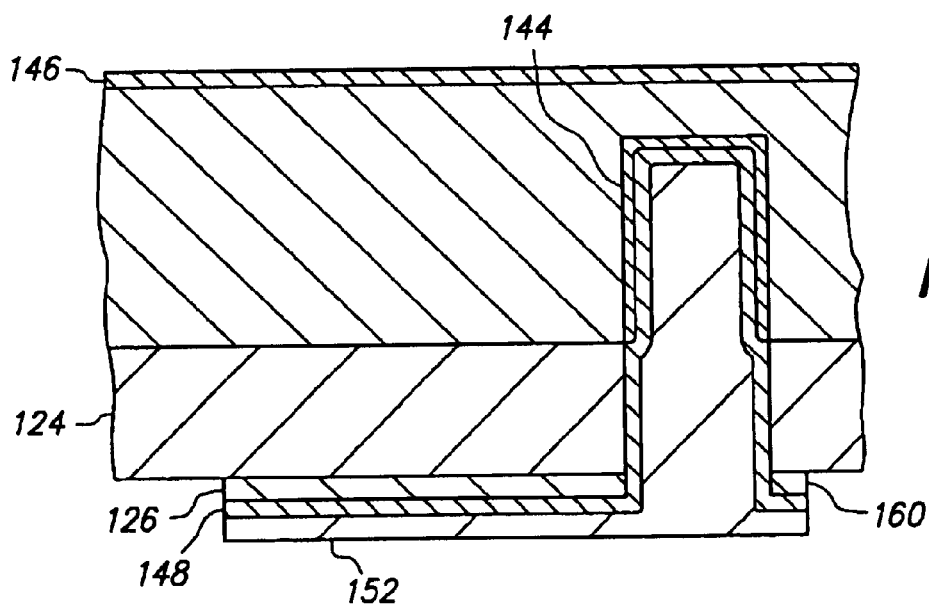
Figure 2L:
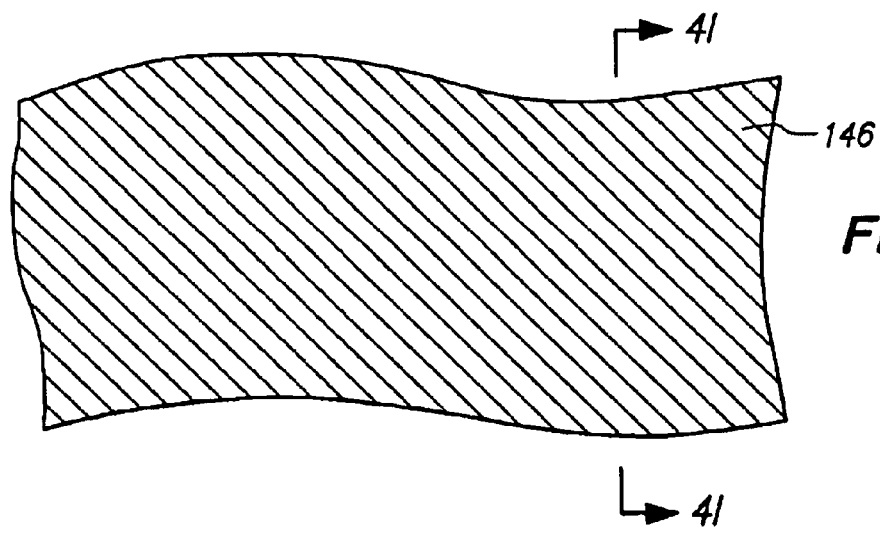
Figure 3L:
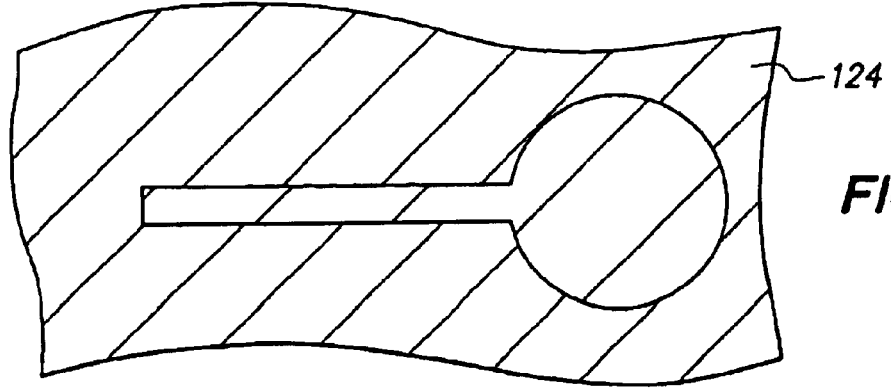
Figure 1J:
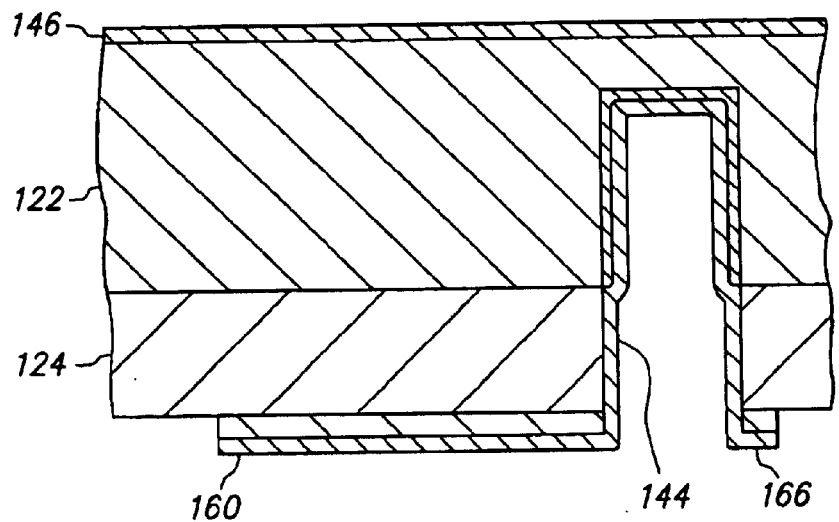
Figure 2J:
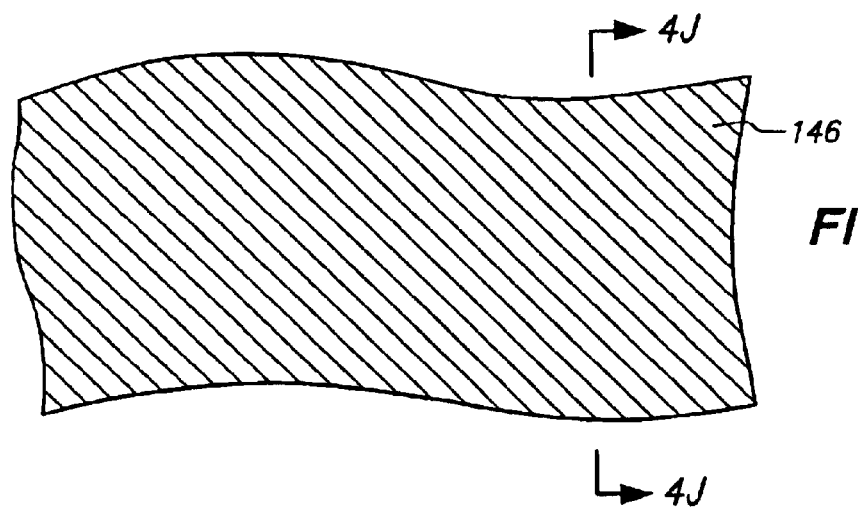
Figure 3J:
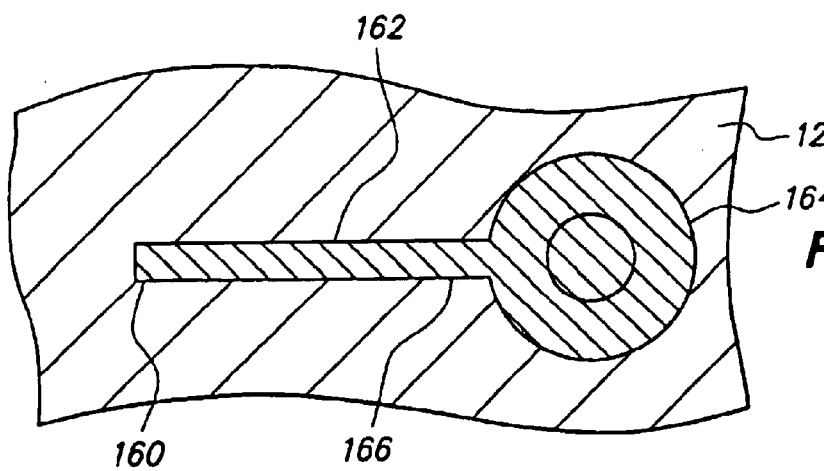
Figure 1K:
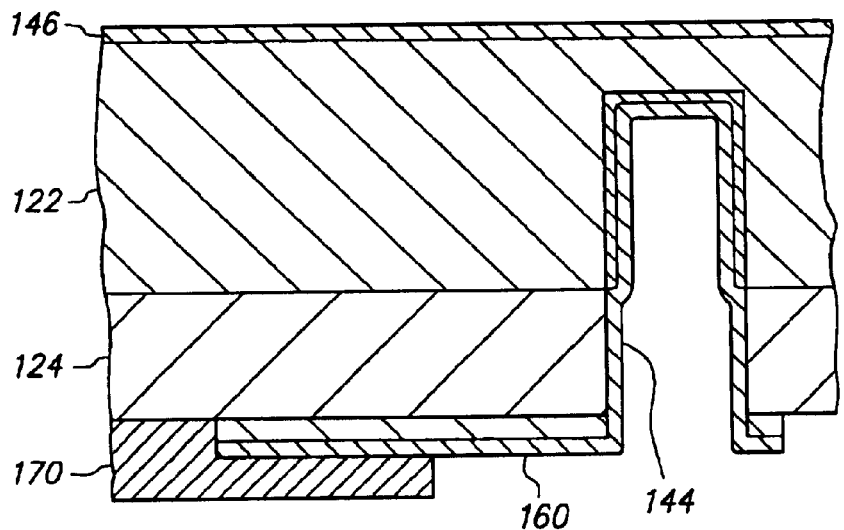
Figure 2K:
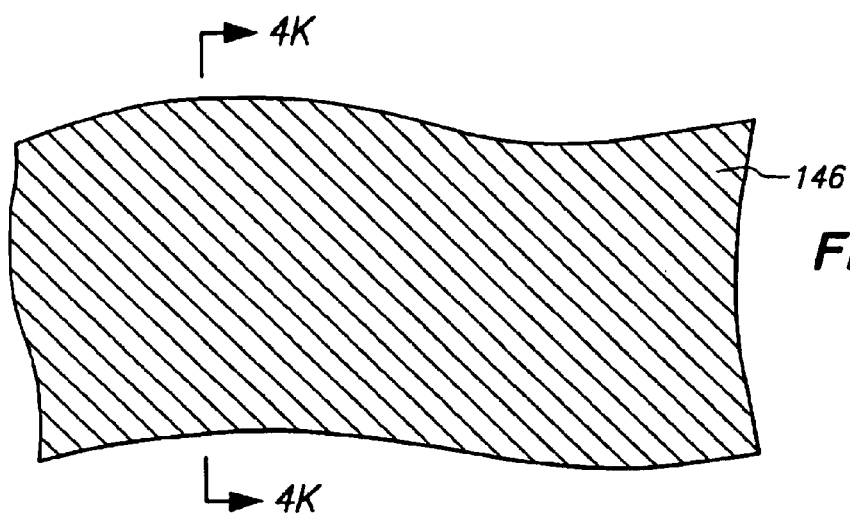
Figure 3K:
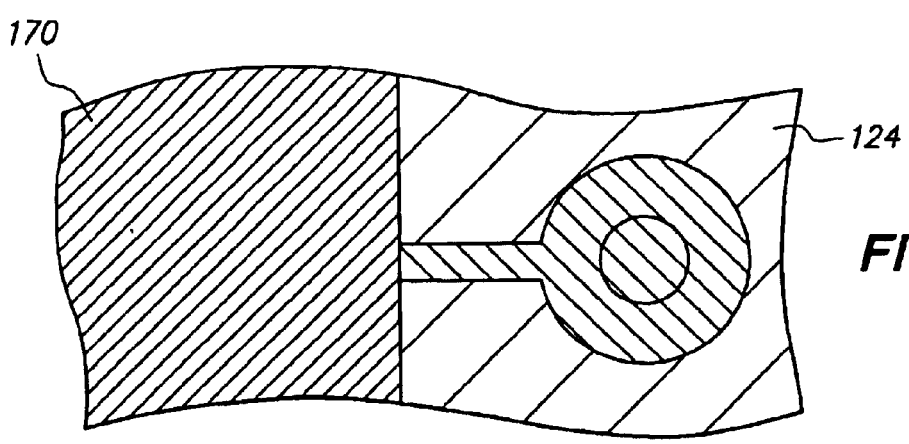
Figure 1L:
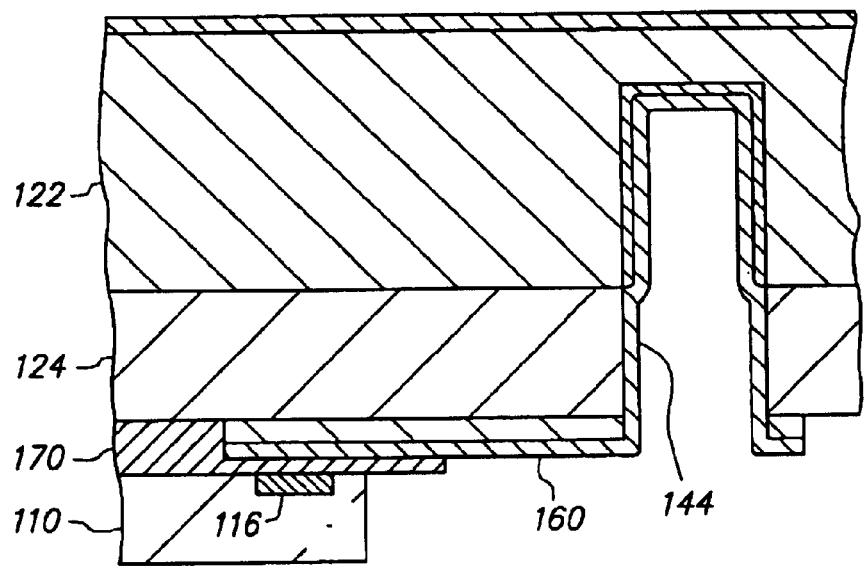
Figure 2L:
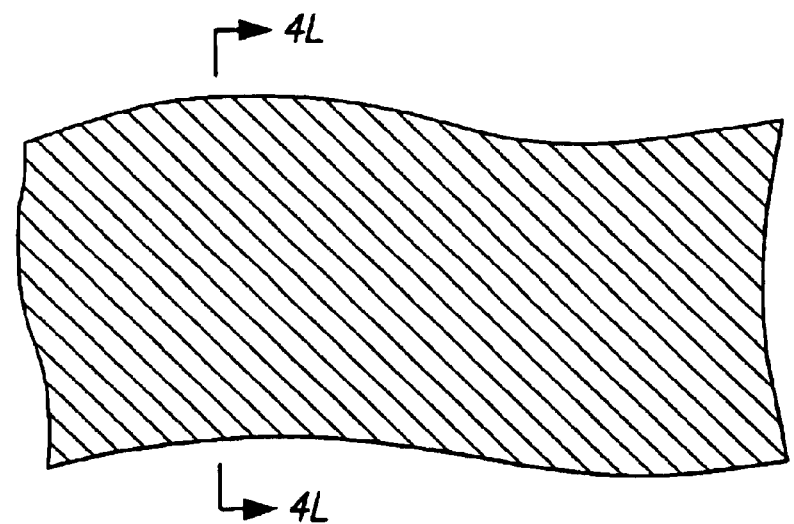
Figure 3L:
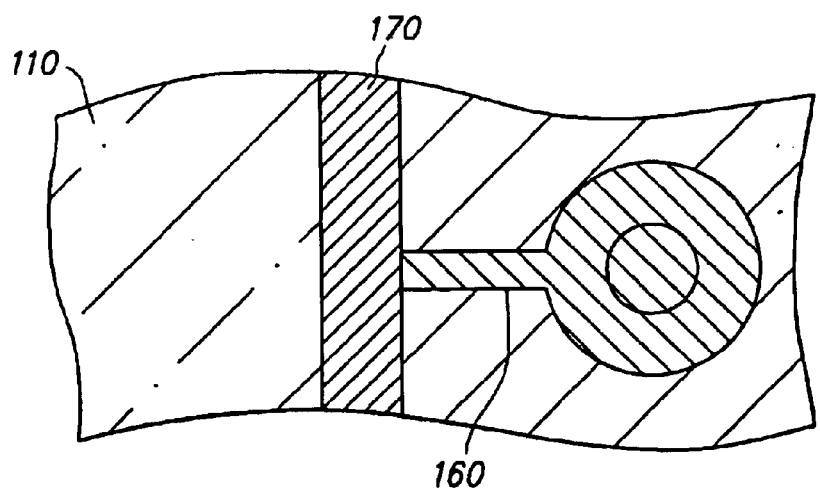
Figure 1M:
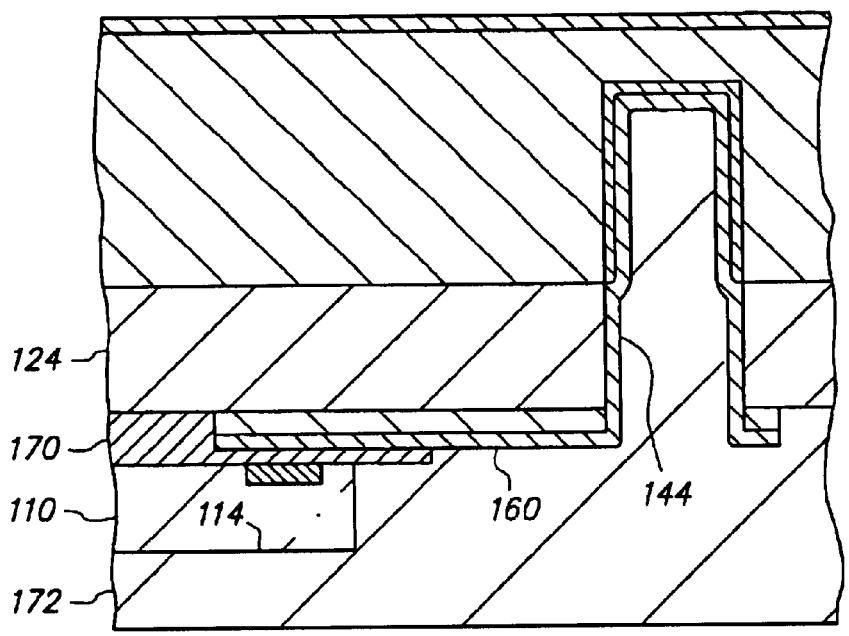
Figure 2M:
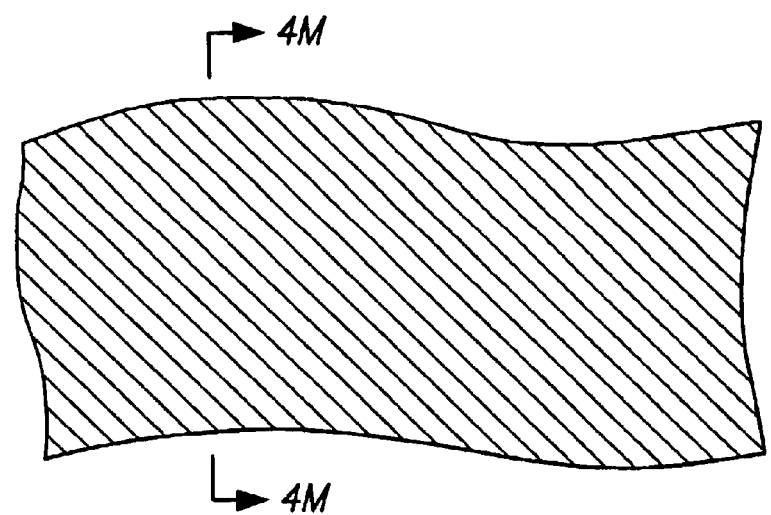
Figure 3M:
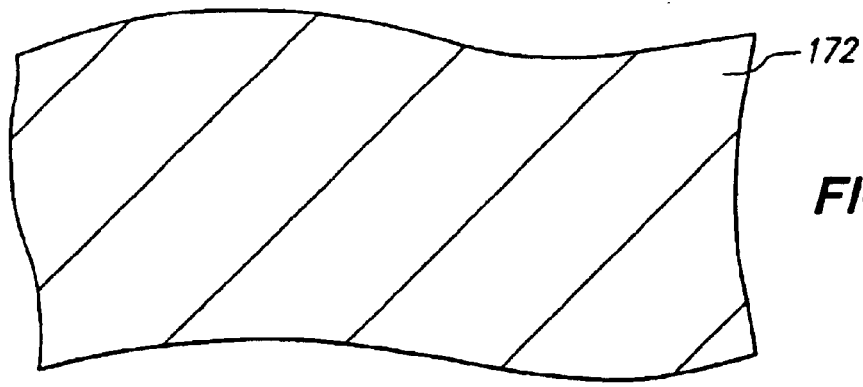
Figure 1N:
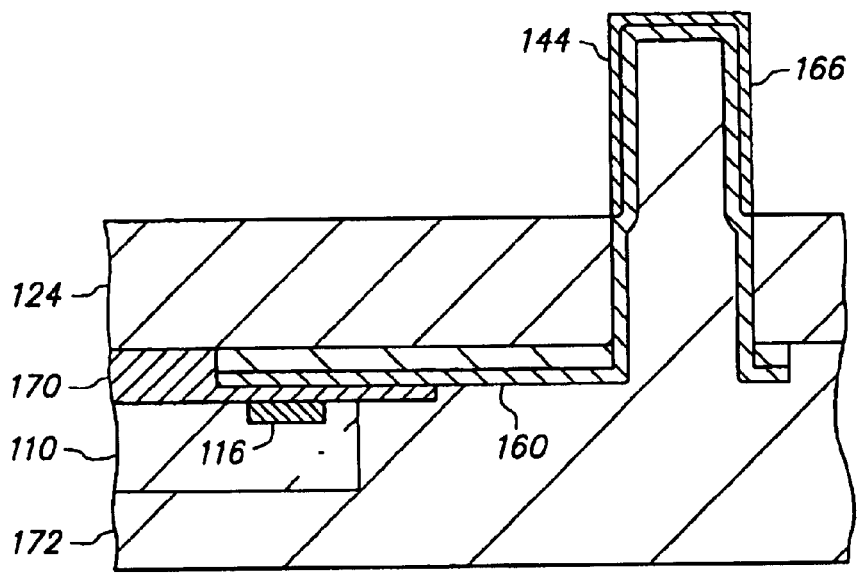
Figure 2N:
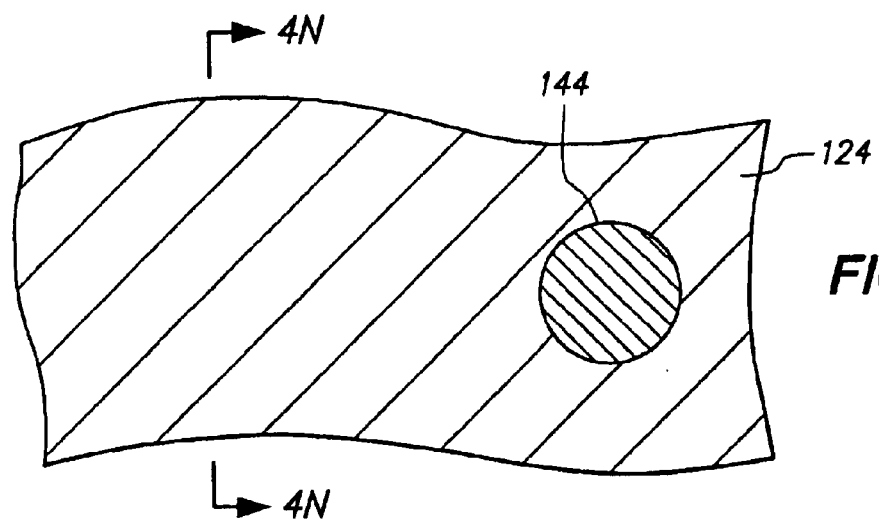
Figure 3N:
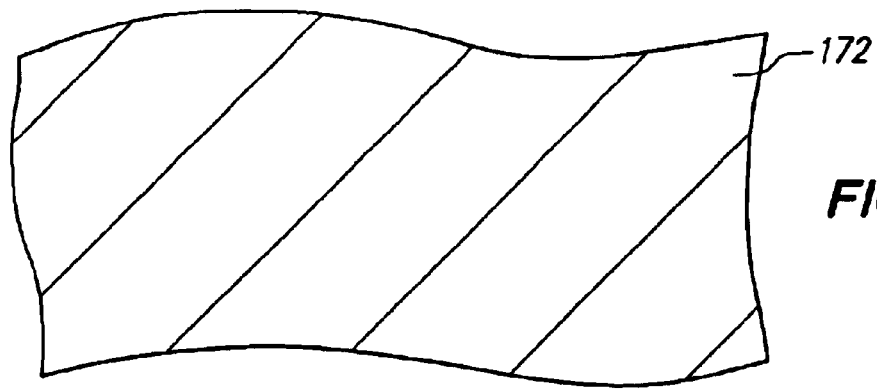
Figure 1O:
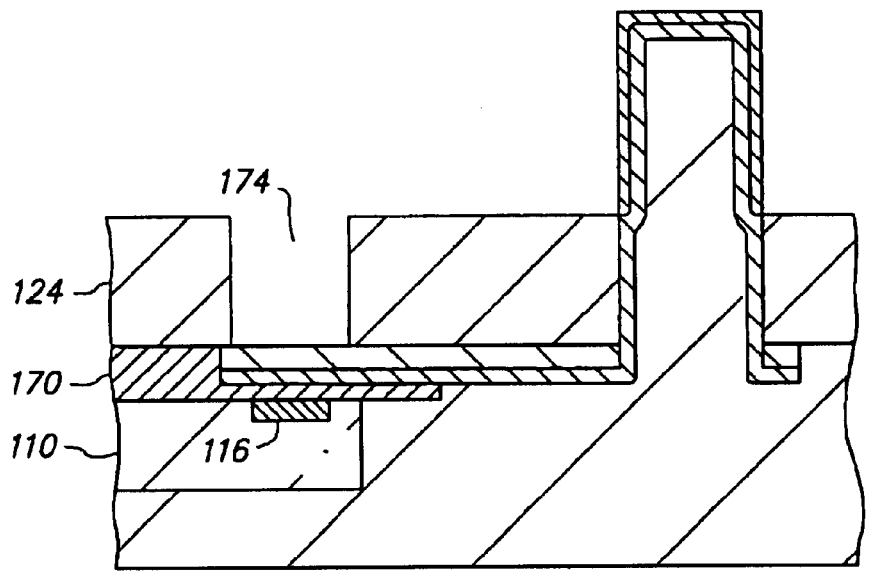
Figure 2O:
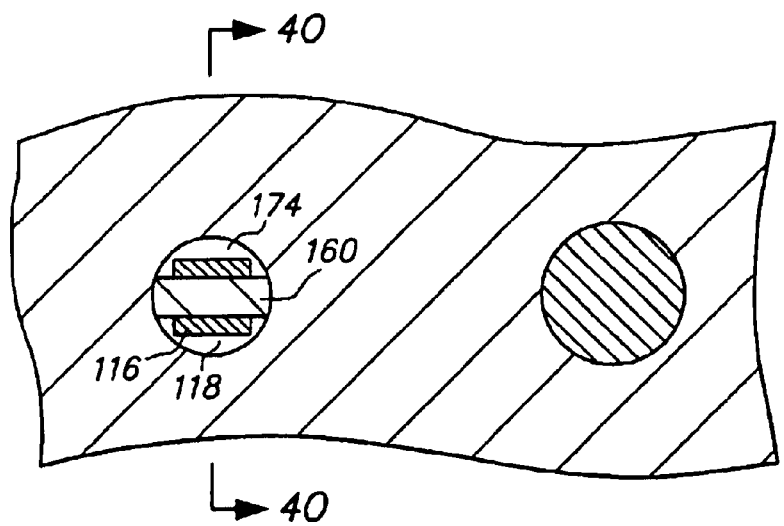
Figure 3O:
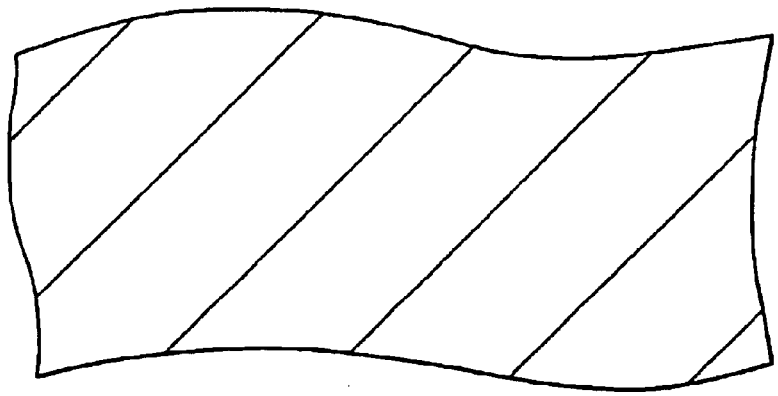
Figure 1P:
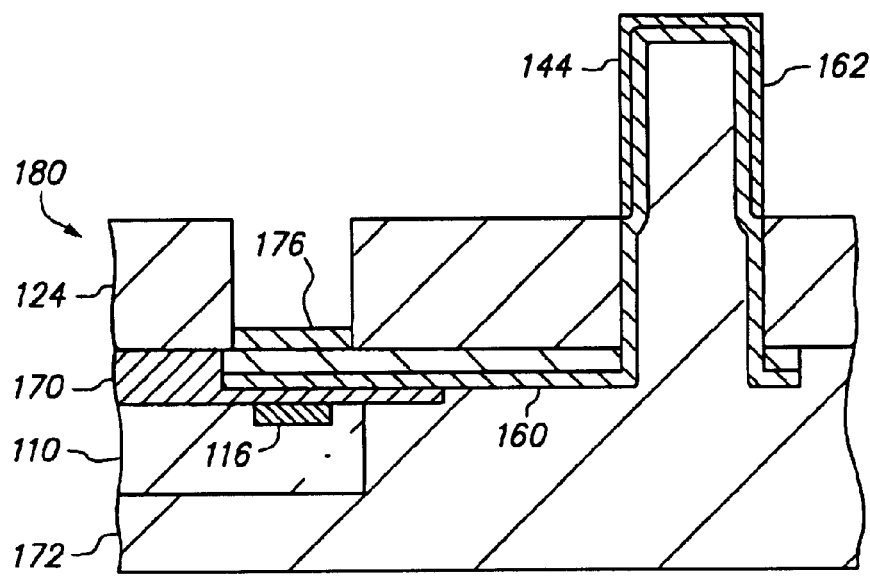
Figure 2P:
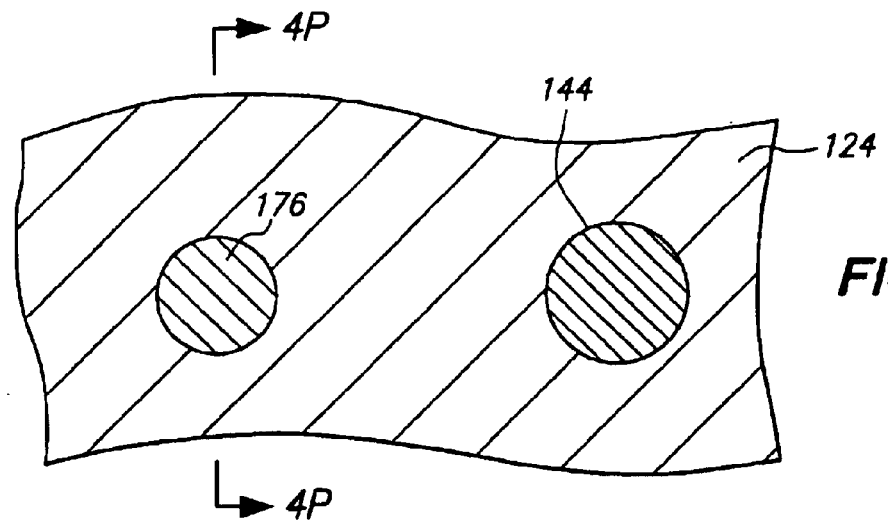
Figure 3P:
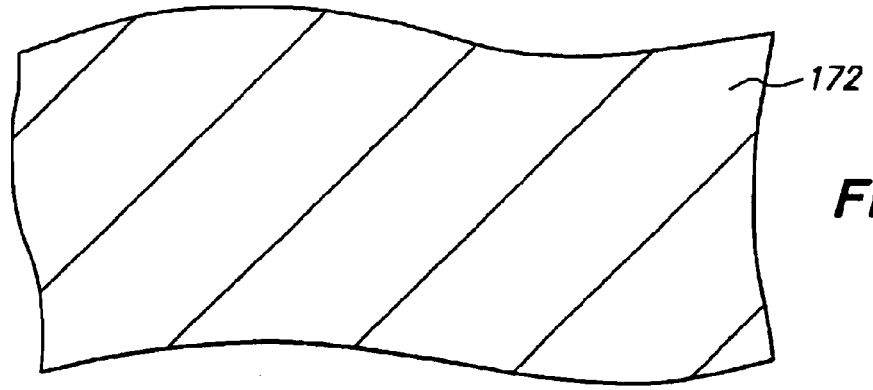
Figure 4A:
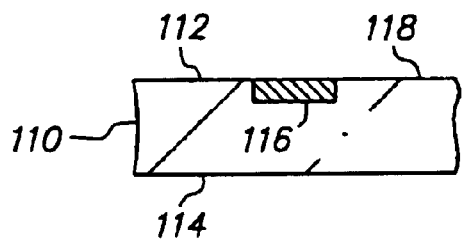
FIGS. 4A–4P are cross-sectional views corresponding to FIGS. 1A–1P, respectively.
Figure 4B:
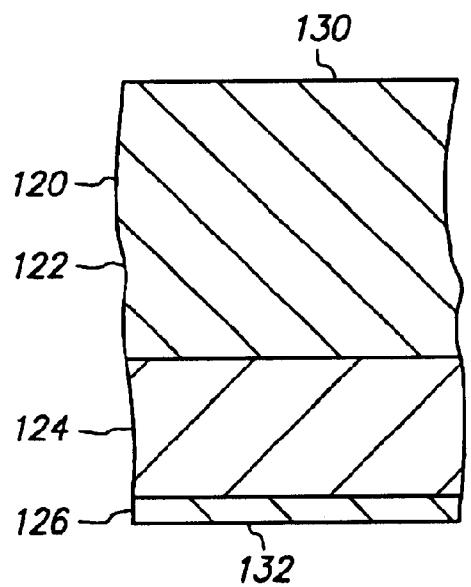
Figure 4C:
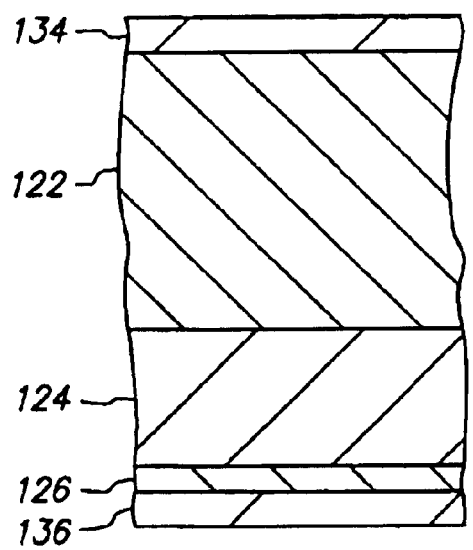
Figure 4D:
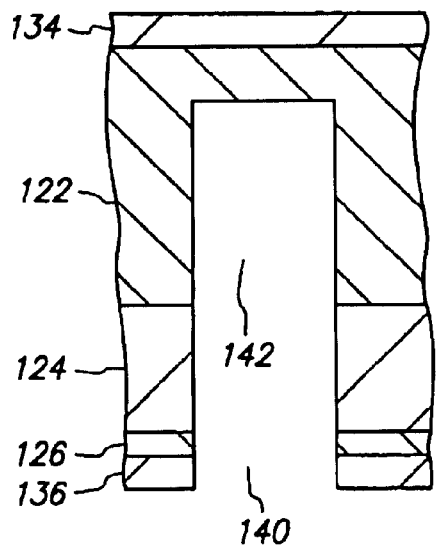
Figure 4E:
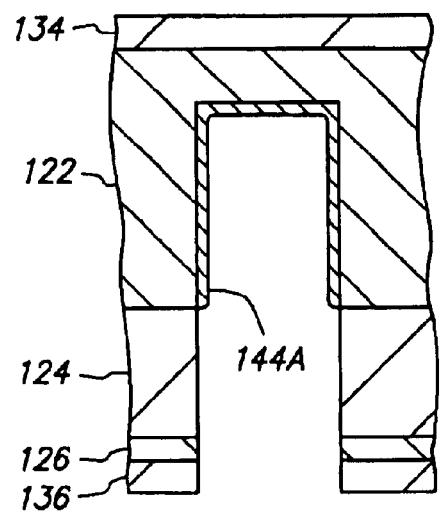
Figure 4F:
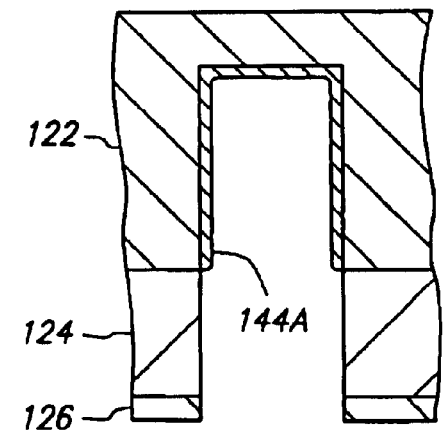
Figure 4G:
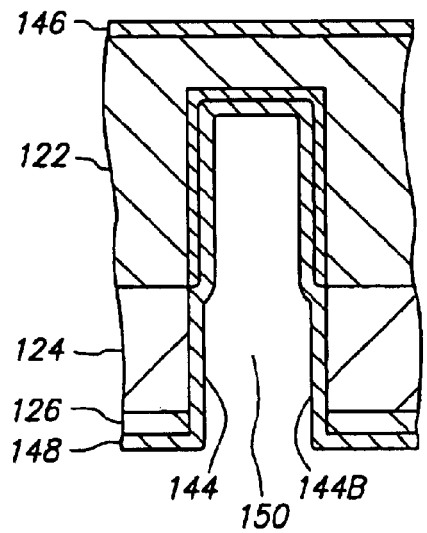
Figure 4H:
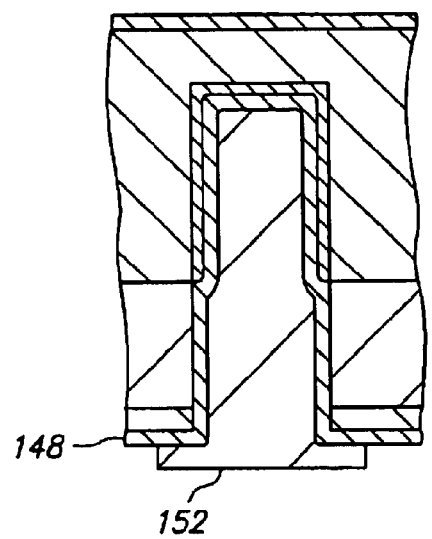
Figure 4I:
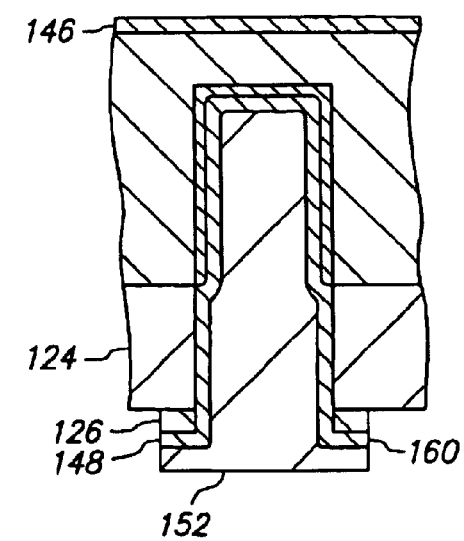
Figure 4J:
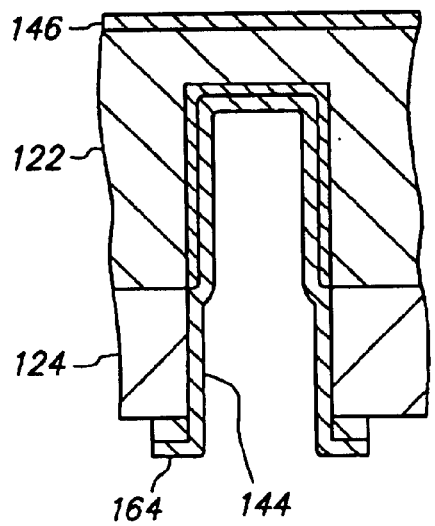
Figure 4K:
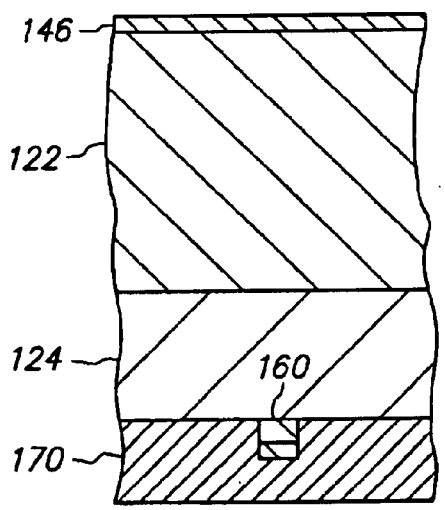
Figure 4L:
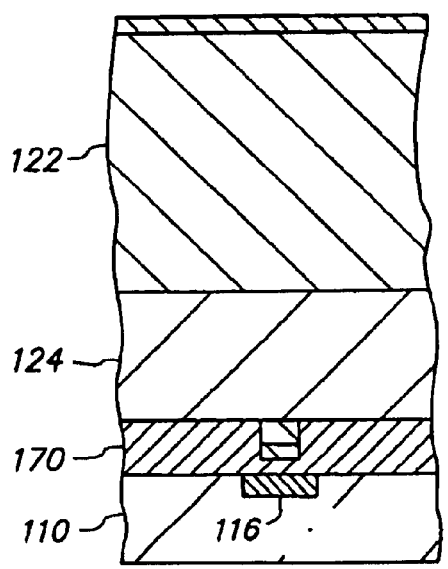
Figure 4M:
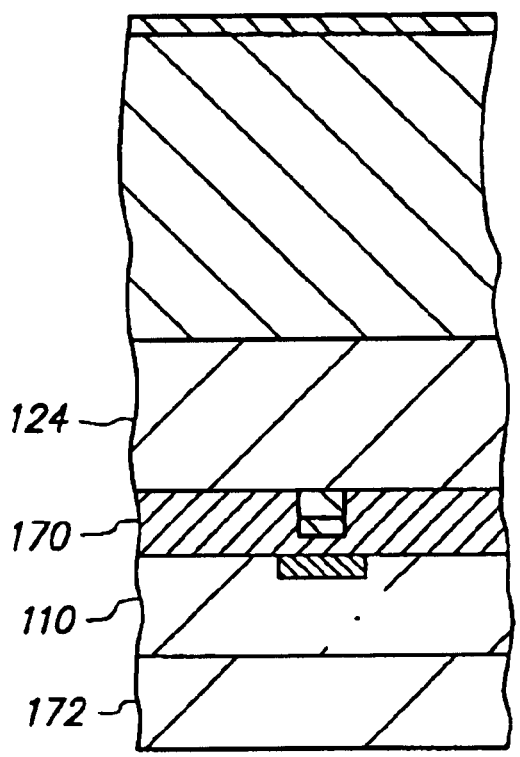
Figure 4N:
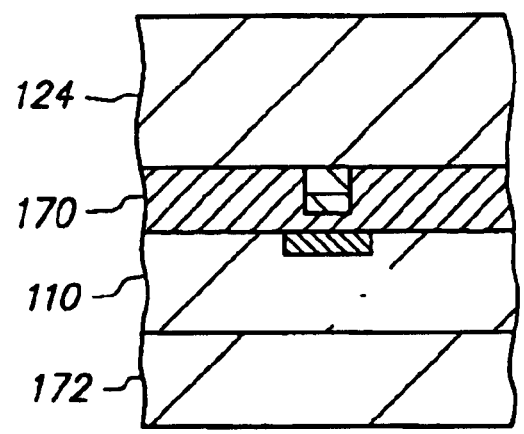
Figure 4O:
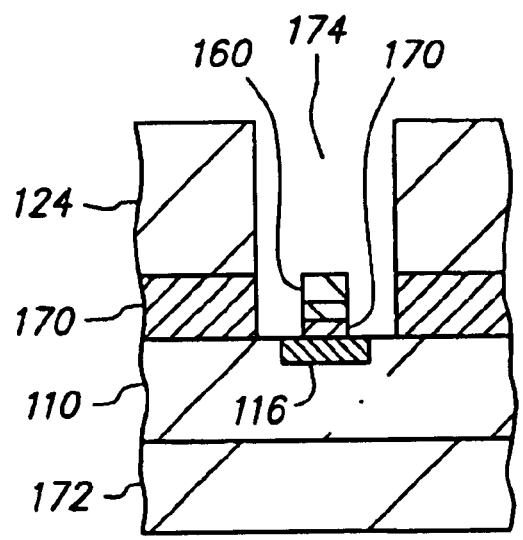
Figure 4P:
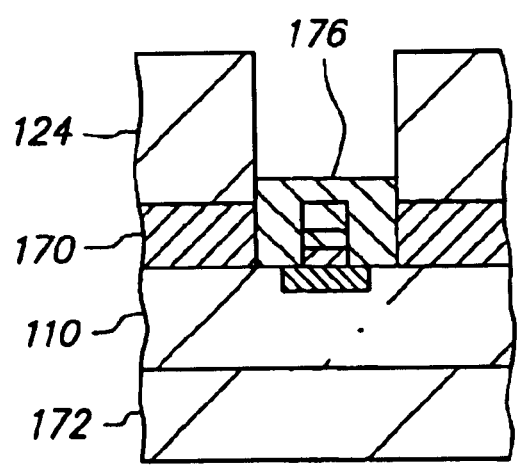

FIGS. 1A–1P, 2A–2P, 3A–3P and 4A–4P are cross-sectional, top, bottom and cross-sectional views, respectively, of a method of making a semiconductor chip assembly in accordance with an embodiment of the present invention. FIGS. 4A–4P are oriented orthogonally with respect to FIGS. 1A–1P and depict FIGS. 1A–1P as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 includes conductive pad 116 and passivation layer 118. Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water.

Chip 110 includes many other pads on surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of laminated structure 120 which includes metal base 122, insulative base 124 and metal layer 126. Laminated structure 120 also includes opposing major surfaces 130 and 132 at metal base 122 and metal layer 126, respectively. Thus, laminated structure 120 is a diclad laminate in which insulative base 124 adhesively attaches metal base 122 and metal layer 126, and metal base 122 and metal layer 126 are separated from one another. Metal base 122 is a copper foil with a thickness of 200 microns, insulative base 124 is a thermoplastic polyimide layer with a thickness of 100 microns, and metal layer 126 is a copper foil with a thickness of 12 microns.

FIGS. 1C, 2C, 3C and 4C are cross-sectional, top, bottom and cross-sectional views, respectively, of masking films 134 and 136 formed on metal base 122 and metal layer 126, respectively. Masking films 134 and 136 are deposited on metal base 122 and metal layer 126, respectively, as dry films of epoxy (B stage) using a dry film lamination process in which hot rolls simultaneously press the dry films onto surfaces 130 and 132, respectively. Thereafter, the dry films are cured or hardened at a relatively low temperature in the range of 100–250° C. to form masking films 134 and 136 as solid adherent epoxy layers (C stage) with a thickness of 50 microns.

FIGS. 1D, 2D, 3D and 4D are cross-sectional, top, bottom and cross-sectional views, respectively, of via 140 formed in laminated structure 120 and masking film 136. Via 140 is an opening formed by mechanical drilling that extends through masking film 136, metal layer 126 and insulative base 124, and into but not through metal base 122. Via 140 has a diameter of 300 microns, and extends 150 microns into recess 142 in metal base 122, but does not reach the remaining 50 microns of metal base 122 or masking film 134.

FIGS. 1E, 2E, 3E and 4E are cross-sectional, top, bottom and cross-sectional views, respectively, of first bumped terminal portion 144A formed on metal base 122 at recess 142. First bumped terminal portion 144A includes a gold layer deposited on metal base 122, a nickel layer deposited on the gold layer, and a copper layer deposited on the nickel layer. For convenience of illustration, the gold, nickel and copper layers are shown as a single layer. The gold layer is 0.5 microns thick, the nickel layer is 3 microns thick, and the copper layer is 5 microns thick. As a result, first bumped terminal portion 144A has a thickness of 8.5 microns, and the diameter of recess 142 is narrowed to 283 microns (300−(2*8.5)).

First bumped terminal portion 144A is formed by an electroplating operation. Thus, first bumped terminal portion 144A is formed additively. Initially, metal base 122 is connected to a plating bus (not shown), current is applied to the plating bus from an external power source, and the structure is submerged in an electrolytic gold plating solution such as Technic Orotemp at room temperature to electroplate the gold layer on metal base 122. Thereafter, the structure is removed from the electrolytic gold plating solution and submerged in an electrolytic nickel plating solution such as Technic Techni Nickel "S" at room temperature while current is applied to the plating bus to electroplate the nickel layer on the gold layer. Thereafter, the structure is removed from the electrolytic nickel plating solution and submerged in an electrolytic copper plating solution such as Sel-Rex CUBATH M™ at room temperature while current is applied to the plating bus to electroplate the copper layer on the nickel layer. Thereafter, the structure is removed from the electrolytic copper plating solution and rinsed in distilled water to remove contaminants.

Advantageously, the copper layer provides an excellent electrical conductor, the nickel layer provides a wettable surface so that a solder ball (not shown) can be subsequently deposited on the bumped terminal and reflowed during the next level assembly, and the gold layer prevents the nickel layer from oxidizing and dissolves into the solder during the reflow operation.

Second bumped terminal portion 144B includes a first copper layer deposited on insulative base 124, metal layer 126 and first bumped terminal portion 144A, and a second copper layer deposited on the first copper layer. Similarly, metal layer 146 includes a first copper layer deposited on surface 130 of metal base 122 and a second copper layer deposited on the first copper layer, and metal layer 148 includes a first copper layer deposited on surface 132 of metal layer 126 and a second copper layer deposited on the first copper layer. For convenience of illustration, the first and second copper layers are shown as a single layer. The first copper layers are 0.5 microns thick, and the second copper layers are 10 microns thick. As a result, second bumped terminal portion 144B, metal layer 146 and metal layer 148 have a thickness of 10.5 microns. In addition, bumped terminal 144 has a thickness of 10.5 microns inside insulative base 124 and metal layer 126, and a thickness 19 microns (8.5+10.5) inside metal base 122. Likewise, of the diameter of cavity 150 at insulative base 124 and metal layer 126 is 279 microns (300−(2*10.5)), and the diameter of cavity 150 at metal base 122 is 262 microns (283−(2* 10.5)).

First bumped terminal portion 144A is disposed on metal base 122 at recess 142 in via 140. However, first bumped terminal portion 144A does not deposit on insulative base 124 or metal layer 126. To elaborate, insulative base 124 is an electrical insulator, and therefore cannot supply current from the plating bus to generate electroplating. Metal layer 126 is not connected to the plating bus, and first bumped terminal portion 144A does not extend across insulative base 124 and contact metal layer 126. Furthermore, masking film 134 prevents metal from electroplating on surface 130 of metal base 122. Masking film 136 is not needed to prevent metal from electroplating on surface 132 of metal layer 126, but protects metal layer 126 from contaminants during the dry film lamination process mentioned above.

FIGS. 1F, 2F, 3F and 4F are cross-sectional, top, bottom and cross-sectional views, respectively, of laminated structure 120 and first bumped terminal portion 144A after masking films 134 and 136 are stripped. Masking films 134 and 136 are removed by being peeled off since they adhere relatively weakly to the structure and do not contain isolated segments, and the peeling off process is more economical and convenient than applying a solvent. Therefore, no appreciable amount of metal base 122, insulative base 124, metal layer 126 or first bumped terminal portion 144A is removed.

FIGS. 1G, 2G, 3G and 4G are cross-sectional, top, bottom and cross-sectional views, respectively, of second bumped terminal portion 144B, metal layer 146 and metal layer 148 formed on the structure. Second bumped terminal portion 144B is formed on insulative base 124, metal layer 126 and first bumped terminal portion 144A in via 140. Metal layer 146 formed on metal base 122 opposite via 140. Metal layer 148 is formed on metal layer 126 outside via 140.

The combination of first bumped terminal portion 144A and second bumped terminal portion 144B forms bumped terminal 144. Bumped terminal 144 includes or defines cavity 150 that faces away from metal base 122 and is exposed. Cavity 150 includes the remaining space in via 140. Thus, bumped terminal 144 and cavity 150 each extend through metal layer 126 and insulative base 124, and extend into but not through metal base 122.

Second bumped terminal portion 144B includes a first layer deposited on insulative base 124, metal layer 126 and first bumped terminal portion 144A, and a second copper layer deposited on the first copper layer. Similarly, metal layer 146 includes a first copper layer deposited on surface 130 of metal base 122 and a second copper layer deposited on the first copper layer, and metal layer 148 includes a first copper layer deposited on surface 132 of metal layer 126 and a second copper layer deposited on the first copper layer. For convenience of illustration, the first and second copper layers are shown as a single layer. The first copper layers are 0.5 microns thick, and the second copper layer are 10 microns thick. As a result, second bumped terminal portion 144B, metal layer 146 and metal layer 148 have a thickness of 10.5 microns. In addition, bumped terminal 144 has a thickness of 10.5 microns inside insulative base 124 and metal layer 126, and a thickness 19 microns (8.5+10.5) inside metal base 122. Likewise, of the diameter of cavity 150 at insulative base 124 and metal layer 126 is 279 microns (300−(2*10.5)), and the diameter of cavity 150 at metal base 122 is 262 microns (283−(2*10.5)).

Second bumped terminal portion 144B, metal layer 146 and metal layer 148 are formed by an electroless plating operation followed by an electroplating operation.

Electroless plating provides metal deposition by an exchange reaction between metal complexes in a solution and a catalytic metal that activates or initiates the reaction. As a result, the electroless metal continually plates (i.e., deposits or grows) on the catalytic metal. The reaction does not require externally applied electric current, and therefore electroless plating can proceed without a plating bus.

Metal base 122, metal layer 126 and the exposed surface (or copper layer) of first bumped terminal portion 144A are composed of copper, and therefore are catalytic to electroless copper. However, insulative base 124 is not catalytic to electroless copper. Therefore, insulative base 124 needs to be rendered catalytic lo electroless copper before the electroless plating operation begins. To accomplish this, the structure is dipped in a copper activator solution such as dilute palladium chloride of approximately 0.1 grams of palladium chloride and 5 cubic centimeters of hydrochloric acid per liter of water for 10 seconds. A suitable copper activator solution is Shipley CATAPOSIT™. Palladium becomes trapped in the exposed surfaces of insulative base 124, thereby providing a nucleation layer that renders these surfaces catalytic to electroless copper.

Thereafter, the structure is removed from the copper activator solution and submerged in an electroless copper plating solution such as Shipley CUPOSIT™ 250 at 60° C. and the first copper layer deposits on metal base 122, insulative base 124, metal layer 126 and first bumped terminal portion 144A, thereby electrically connecting metal base 122 to metal layer 126 and assuring that all sidewall portions of via 140 are covered with plated metal.

Thereafter, the structure is removed from the electroless copper plating solution, metal base 122 is connected to a plating bus (not shown), current is applied to the plating bus from an external power source, and the structure is submerged in an electrolytic copper plating solution such as Sel-Rex CUBATH M™ at room temperature while current is applied to the plating bus to electroplate the second copper layer on the first copper layer. Thereafter, the structure is removed from the electrolytic copper plating solution and rinsed in distilled water to remove contaminants.

FIGS. 1H, 2H, 3H and 4H are cross-sectional, top, bottom and cross-sectional views, respectively, of photoresist layer 152 formed on bumped terminal 144 and metal layer 148. Photoresist layer 152 is deposited in liquid form using roller coating and fills cavity 150. A reticle (not shown) is positioned proximate to photoresist layer 152 using via 140 as a registration point so that the reticle is precisely located relative to via 140. Thereafter, photoresist layer 152 is patterned by selectively applying light through the reticle, applying a developer solution to remove the photoresist portions rendered soluble by the light, and then hard baking, as is conventional. As a result, photoresist layer 152 contains opening 154 that selectively exposes portion 156 of metal layer 148. Photoresist layer 152 has a thickness of 15 microns outside via 140.

For convenience of illustration, photoresist layer 152 is shown below metal layers 126 and 148 to retain a single orientation throughout the figures for ease of comparison between the figures, although in this step the structure would be inverted so that gravitational force would assist the liquid photoresist with filling cavity 150.

FIGS. 1I, 2I, 3I and 4I are cross-sectional, top, bottom and cross-sectional views, respectively, of routing line 160 formed in metal layers 126 and 148. Routing line 160 is formed by applying a wet chemical etch to metal layers 126 and 148 using photoresist layer 152 as an etch mask. A "back-side" wet chemical etch is applied to photoresist layer 152 without being applied to the opposite or "front-side" at metal layer 146. For instance, the wet chemical etch can be sprayed on the back-side, or the front-side can be covered by a mask and then the structure can be dipped in the wet chemical etch.

The wet chemical etch etches completely through metal layers 126 and 148, thereby effecting a pattern transfer of photoresist layer 152 onto metal layers 126 and 148. The wet chemical etch is highly selective of copper with respect to polyimide, and therefore, after the wet chemical etch etches through metal layer 148 then metal layer 126 and contacts insulative base 124, no appreciable amount of insulative base 124 is removed. Thus, routing line 160 constitutes a remaining or unetched portion of metal layers 126 and 148 after the wet chemical etch is applied. Furthermore, photoresist layer 152 prevents the wet chemical etch from entering via 140 and attacking bumped terminal 144.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing the structure to the wet chemical etch in order to form routing line 160 with a negligible undercut can be established through trial and error.

FIGS. 1J, 2J, 3J and 4J are cross-sectional, top, bottom and cross-sectional views, respectively, of the structure after photoresist layer 152 is stripped. Photoresist layer 152 is removed using a solvent, such as a mild alkaline solution with a pH of 9, that is highly selective of photoresist with respect to copper and polyimide. Therefore, no appreciable amount of metal base 122, insulative base 124, bumped terminal 144, metal layer 146 or routing line 160 is removed. Furthermore, cavity 150 becomes exposed.

Routing line 160 includes an elongated routing region 162 with a width (orthogonal to its elongated length) of 30 microns, and an enlarged circular region 164 with a diameter of 500 microns. Bumped terminal 144 is axially centered within enlarged circular region 164. Thus, bumped terminal 144 has outer vertical sidewalls that are laterally spaced from the outer edges of enlarged circular region 164 by 100 microns ((500−300)12).

The combination of bumped terminal 144 and routing line 160 provides conductive trace 166 that is adapted for providing horizontal and vertical routing between pad 116 and a terminal on a printed circuit board (not shown) in a next level assembly.

FIGS. 1K, 2K, 3K and 4K are cross-sectional, top, bottom and cross-sectional views, respectively, of adhesive 170 formed on insulative base 124 and routing line 160. Adhesive 170 may include an organic surface protectant such as HK 2000 which is promptly applied to the structure after the masking films are stripped to reduce native oxide formation on the exposed copper surfaces. The use of organic surface protectant layers in insulative adhesives for semiconductor chip assemblies is well-known in the art. Thereafter, a liquid resin (A stage) such as polyamic acid is applied over a predetermined portion of the structure using stencil printing. The liquid resin flows over insulative base 124 and routing line 160. Adhesive 170 has a thickness of 30 microns as measured from insulative base 124 outside routing line 160. However, adhesive 170 does not contact metal base 122, bumped terminal 144 or metal layer 146.

For convenience of illustration, adhesive 170 is shown below insulative base 124 to retain a single orientation throughout the figures for ease of comparison between the figures, although in this step the structure would be inverted so that gravitational force would assist the liquid resin flow.

FIGS. 1L, 2L, 3L and 4L are cross-sectional, top, bottom and cross-sectional views, respectively, of chip 110 mechanically attached to laminated structure 120 by adhesive 170. Adhesive 170 is disposed between and contacts chip 110 and insulative base 124, and likewise, adhesive 170 is disposed between and contacts chip 110 and routing line 160. Thus, chip 110 and insulative base 124 do not contact one another, and chip 110 and routing line 160 do not contact one another.

Chip 110 and laminated structure 120 are positioned relative to one another so that chip 110 is disposed within the surface area of adhesive 170, routing line 160 is disposed above and overlaps and is electrically isolated from pad 116, routing line 160 extends within and outside the periphery of chip 110, and bumped terminal 144 is disposed outside the periphery of chip 110. Chip 110 and laminated structure 120 can be aligned using an automated pattern recognition system. Adhesive 170 is sandwiched between chip 110 and laminated structure 120 using relatively low pressure. Thereafter, adhesive 170 is heated and fully cured (C stage) at relatively low temperature in the range of 200 to 250° C. to form a solid adhesive electrically insulative thermosetting polyimide layer that mechanically fastens chip 110 to laminated structure 120. Adhesive 170 is 3 microns thick between pad 116 and routing line 160.

At this stage, insulative base 124 and bumped terminal 144 are covered from above by metal base 122, routing line 160 is covered from above by insulative base 124, the portion of routing line 160 within and slightly outside the periphery of chip 110 is covered from below by adhesive 170, the portion of conductive trace 166 more than slightly outside the periphery of chip 110 is not covered from below, bumped terminal 144 is not covered from below and therefore cavity 150 is exposed, pad 116 is covered from above by adhesive 170, and pad 116 is separated from routing line 160 by the thickness of adhesive 170.

FIGS. 1M, 2M, 3M and 4M are cross-sectional, top, bottom and cross-sectional views, respectively, of encapsulant 172 formed on chip 110, insulative base 124, routing line 160 and adhesive 170 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art. Encapsulant 172 contacts surface 114 of chip 110, the outer edges of chip 110, and surfaces of insulative base 124, bumped terminal 144, routing line 160 and adhesive 170 that face towards and are outside the periphery of chip 110 without contacting metal base 122. Encapsulant 172 also extends into the remaining space in via 140 and fills cavity 150. Encapsulant 172 is a solid adherent compressible protective layer that provides back-side environmental protection such as moisture resistance and particle protection for chip 110 as well as mechanical support for insulative base 124, bumped terminal 144 and routing line 160 outside the periphery of chip 110. Encapsulant 172 is 100 microns thick beyond surface 114.

FIGS. 1N, 2N, 3N and 4N are cross-sectional, top, bottom and cross-sectional views, respectively, of the structure after metal base 122 and metal layer 146 are removed by wet chemical etching. The wet chemical etch can be sprayed on metal layer 146, or the structure can be dipped in the wet chemical etch since chip 110 and routing line 160 are protected by insulative base 124 and encapsulant 172. A suitable wet chemical etch can be provided by the same solution used for etching metal layers 126 and 148 to form routing line 160. The wet chemical etch is highly selective of copper with respect to gold, polyimide and the molding compound. Therefore, no appreciable amount of insulative base 124, bumped terminal 144 or encapsulant 172 is removed. The optimal etch time for exposing the structure to the wet chemical etch in order to completely remove metal base 122 and metal layer 146 without excessively exposing the gold surface layer of bumped terminal 144 to the wet chemical etch can be established through trial and error.

Advantageously, since the wet chemical etch is not selective of insulative base 124, the gold surface layer of bumped terminal 144 or encapsulant 172, there is a wide window of acceptable etch times and little or no endpoint concern. Another advantage is that insulative base 124 and encapsulant 172 provide mechanical support for bumped terminal 144, and therefore reduce the mechanical strain on adhesive 170. A further advantage is that bumped terminal 144 extends from insulative base 124 into but not beyond metal base 122, and therefore does not provide an etch mask for metal base 122. A still further advantage is that insulative base 124 protects conductive trace 166 from chemical and mechanical damage by the wet chemical etch and subsequent cleaning steps (such as rinsing in distilled water and air blowing). For instance, insulative base 124 protects routing line 160 from chemical attack by the wet chemical etch, protects routing line 160 from the physical force of the wet chemical etch and cleaning steps that might otherwise cause routing line 160 to separate from adhesive 170, and protects the lower portion of bumped terminal 144 from the physical force of the wet chemical etch and cleaning steps that might otherwise cause bumped terminal 144 to separate from routing line 160. Accordingly, insulative base 124 improves the structural integrity and allows the wet chemical etch and subsequent cleaning steps to be applied more vigorously, thereby improving manufacturing throughput.

At this stage, adhesive 170 continues to cover pad 116, insulative base 124 and encapsulant 172 provide enhanced mechanical support for conductive trace 166, and encapsulant 172 provides protection for chip 110. The enhanced mechanical strength is particularly useful after metal base 122 is removed. Furthermore, the compressibility of encapsulant 172 permits bumped terminal 144 to provide a compressible, compliant contact terminal. That is, bumped terminal 144 exhibits elastic deformation in response to external pressure. As a result, bumped terminal 144 provides excellent compliance for the next level assembly.

FIGS. 1O, 2O, 3O and 4O are cross-sectional, top, bottom and cross-sectional views, respectively, of the structure after portions of insulative base 124 and adhesive 170 are selectively removed to form through-hole 174 in insulative base 124 and adhesive 170 that exposes pad 116 and routing line 160. Through-hole 174 is formed by applying a suitable etch that is highly selective of insulative base 124 and adhesive 170 with respect to pad 116 and routing line 160.

In this instance, a selective laser etch is applied. Using projection laser ablation, a metal mask (not shown) is positioned above insulative base 124 such that an opening in the metal mask is aligned with pad 116, and a laser is directed to the side of the metal mask opposite insulative base 124. Accordingly, the metal mask targets the laser at pad 116. The laser removes portions of insulative base 124 above routing line 160 and removes portions of insulative base 124 and adhesive 170 above pad 116 and outside routing line 160. Through-hole 174 has a diameter of 100 microns, and pad 116 (with a length and width of 70 microns) is centered within and axially aligned with through-hole 174. Routing line 160 shields the underlying adhesive 170 from the laser etch so that the portion of adhesive 170 sandwiched between routing line 160 and pad 116 remains intact. Through-hole 174 is formed in insulative base 124 and adhesive 170 without damaging pad 116, passivation layer 118 or routing line 160. Thus, through-hole 174 extends through laminated structure 120 and adhesive 170, but does not extend into chip 110.

FIGS. 1P, 2P, 3P and 4P are cross-sectional, top, bottom and cross-sectional views, respectively, of connection joint 176 formed on pad 116 and routing line 160. Connection joint 176 is a conductive adhesive. Connection joint 176 is formed by depositing a non-solidified conductive adhesive and then applying energy to cure the conductive adhesive and form a hardened conductive adhesive joint. Suitable conductive adhesives include a polymer binder (or matrix) and a filler metal powder. Isotropic conductive adhesives in which the electrical conductivity is identical along the three coordinate axes are generally preferred. For instance, conductive epoxy paste that includes an epoxy binder and silver flakes is deposited into through-hole 174 and onto pad 116 and routing line 160 by screen printing. The conductive epoxy paste is then cured by applying UV light.

Connection joint 176 is formed in through-hole 174 and contacts and electrically connects pad 116 and routing line 160. Connection joint 176 contacts and covers portions of pad 116 beneath through-hole 174 and outside routing line 160, the surface of routing line 160 that overlaps and faces away from pad 116, and the outer edges (or peripheral sidewalls) of routing line 160 that overlap and are orthogonal to pad 116. Thus, connection Joint 176 provides a robust, permanent electrical connection between pad 116 and routing line 160.

Connection joint 176 is the only electrical conductor external to chip 110 that contacts pad 116, adhesive 170 and connection joint 176 are the only materials external to chip 110 that contact pad 116, adhesive 170 and connection joint 176 are the only materials that contact both pad 116 and routing line 160, and bumped terminal 144 is the only electrical conductor that is electrically connected to pad 116 and extends to the side of insulative base 124 opposite chip 110.

At this stage, the manufacture of semiconductor chip assembly 180 that includes chip 110, insulative base 124, conductive trace 166, adhesive 170, encapsulant 172 and connection joint 176 can be considered complete. Conductive trace 166 is mechanically coupled to chip 110 by adhesive 170, and is electrically coupled to chip 110 by connection joint 176. Conductive trace 166 extends beyond an outer edge of chip 110 and provides horizontal fan-out routing (via routing line 160) and vertical routing (via bumped terminal 144) between pad 116 and external circuitry. Insulative base 124 and encapsulant 172 provide mechanical support and environmental protection for the assembly. Moreover, insulative base 124 protects routing line 160 from unwanted solder reflow during the next level assembly.

The semiconductor chip assembly includes other conductive traces embedded in insulative base 124 and adhesive 170, and only a single conductive trace 166 is shown for convenience of illustration. The conductive traces are each connected to a respective pad on chip 110 by a respective connection joint. Furthermore, the conductive traces each extend horizontally from their respective pads and contain a bumped terminal at a distal end outside the periphery of chip 110 to provide horizontal fan-out routing and vertical routing for their respective pads. The bumped terminals are the only electrical conductors that extend to the surface of insulative base 124 that faces away from chip 110. Thus, all horizontal routing for the pads that is external to chip 110 occurs at the routing lines between insulative base 124 and chip 110. The conductive traces are electrically isolated from one another by insulative base 124 and adhesive 170 after metal base 122 is removed. Advantageously, there is no plating bus or related circuitry that need be disconnected or severed from chip 110 or the conductive traces after metal base 122 is removed and the connection joints are formed. If desired, solder balls can be screen printed on the tops of the bumped terminals to provide connections to the next level assembly.

The semiconductor chip assembly described above is merely exemplary. Numerous other embodiments are contemplated.

Figure 5:
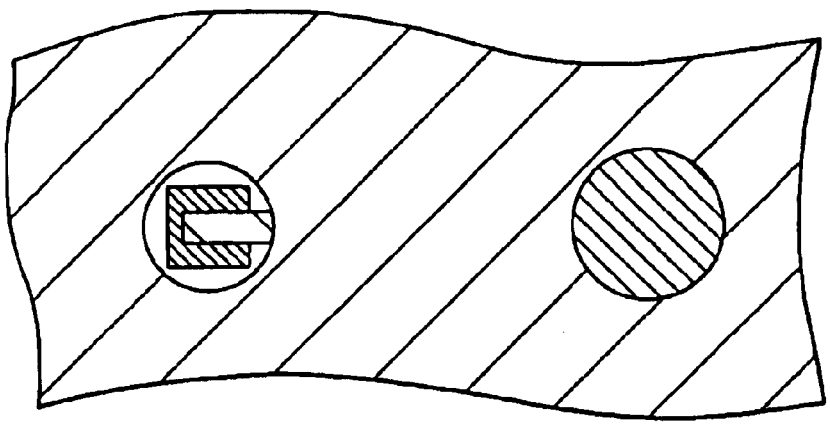
FIGS. 5–9 are top plan views of routing line variations in accordance with the present invention.
Figure 6:
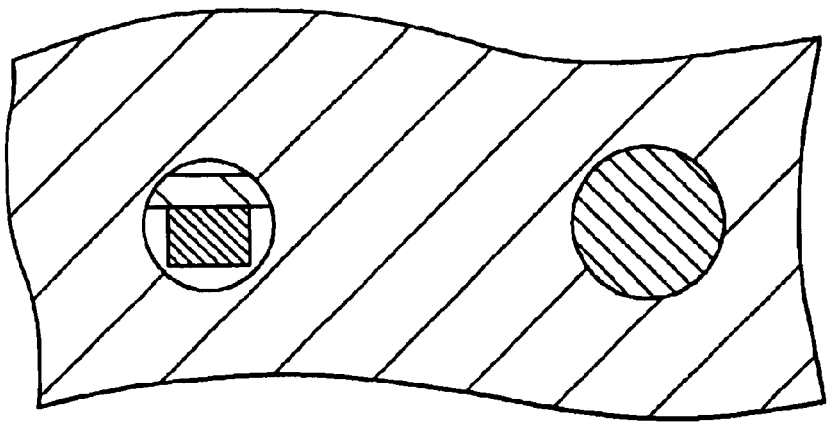
Figure 7:
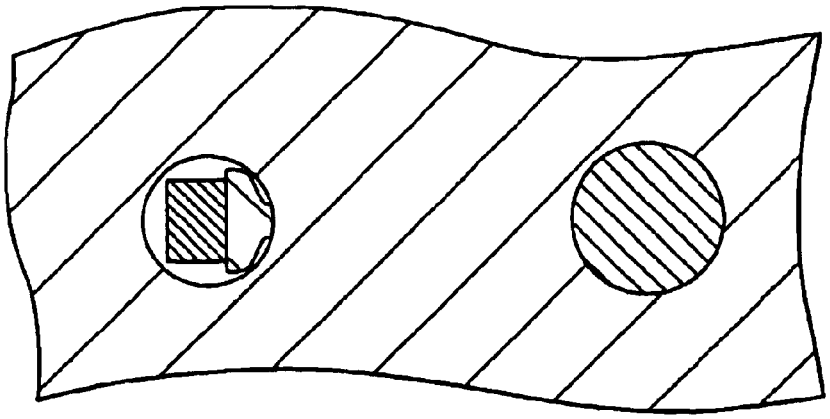
Figure 8:
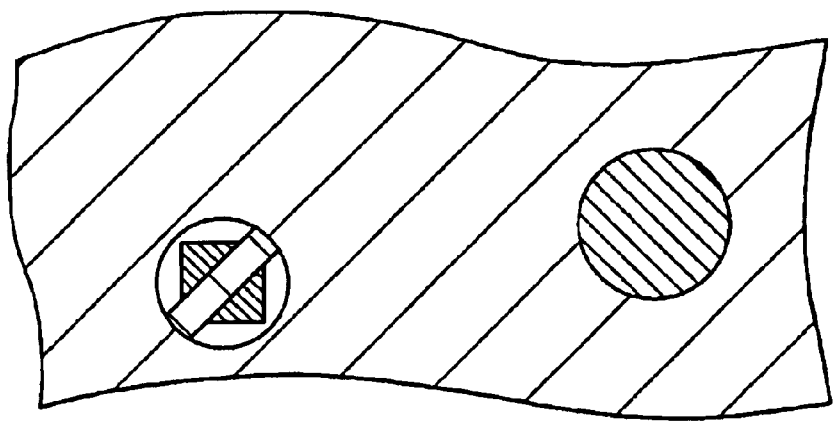
Figure 9:
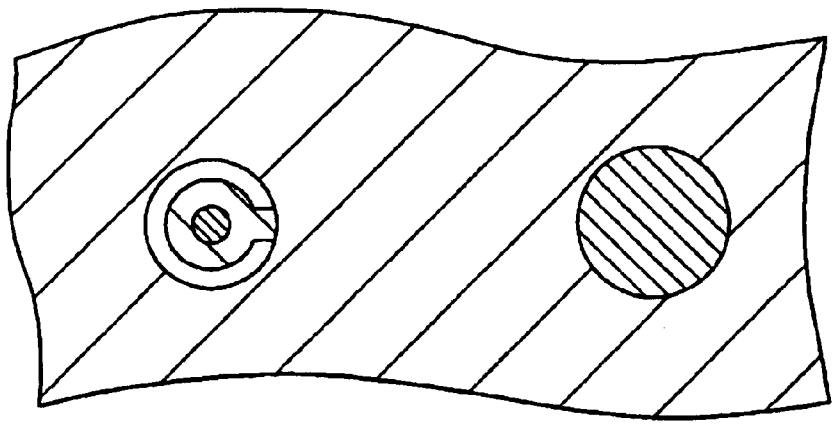

The conductive trace can have various shapes and sizes. The conductive trace can overlap various portions of the pad, such as two opposing peripheral edges and the center of the pad (FIG. 20), one peripheral edge and the center of the pad (FIG. 5), three peripheral edges but not the center of the pad (FIGS. 6 and 7), two corners and the center of the pad (FIG. 8) or four peripheral edges but not the center of the pad (FIG. 9).

The conductive trace can be various conductive metals including copper, gold, nickel, aluminum, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose of the associated chip pad. Likewise, the conductive trace can fan-in or fan-out or both, regardless of whether it includes a bumped terminal.

The laminated structure can be formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are generally more preferred due to their widespread availability and tendency to remain flat without warpage. Commercially available laminates such as NEOFLEX™ diclad by Mitsui Chemicals of Tokyo, Japan are suitable. However, other laminated structures such as single clad laminates (that omit the metal base) and dual-insulator laminates on which the metal base is replaced by a second insulative base that can be selectively etched with respect to the insulative base and the bumped terminal) can also be employed.

The metal base and the metal layer can be various metals such as copper, gold, nickel, aluminum, palladium, tin, combinations thereof, and alloys, and need not necessarily have the same composition.

The metal base and the metal layer can each be a single layer or multiple layers. If desired, the metal layer (or routing line) can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. As another example, the metal layer can include a non-copper layer between a copper layer and the insulative base. Suitable non-copper layers include nickel, gold, palladium and silver. A gold layer is well-suited for receiving a gold ball bond connection joint.

The metal base need not necessarily be removed. For instance, a portion of the metal base above the pad can be selectively etched to permit formation of the through-hole, and another portion of the metal base that contacts the bumped terminal can remain intact and provide part of the conductive trace. Alternatively, a portion of the metal base above the pad can be selectively etched to permit formation of the through-hole, another portion of the metal base that contacts the bumped terminal can be selectively etched so that the bumped terminal is electrically isolated from the metal base, and another portion of the metal base that is disposed within the periphery of the chip can remain intact and provide a heat sink.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in the epoxy resin. Fibers that may be used include aramid, polyester, polyamide, poly-ether-ether-ketone, polyimide, polyetherimide and polysulfone. The fiber reinforcement can be woven fabric, non-woven fabric or paper. Commercially available dielectric materials such as SPEEDBOARD C prepreg by W. L. Gore & Associates of Eau Claire, Wisconsin are suitable.

The insulative base may be disposed between the metal base and the metal layer in numerous manners. For instance, an epoxy resin without reinforcement can be coated onto the metal base and then laminated to the metal layer as heat and pressure are applied. Alternatively, a prepreg with reinforcement can be a dry film that is sandwiched between the metal base and the metal layer and then laminated to the metal base and the metal layer as heat and pressure are applied.

The via can be formed in numerous manners. For instance, the via can be formed with a single removal step such as mechanical drilling, mechanical punching or laser drilling. Alternatively, the via can be formed with multiple removal steps. For example, a first masking film can be deposited on the metal base, a second masking film can be deposited on the metal layer, and the via can be formed through the second masking film using laser drilling, then through the metal layer using wet chemical etching, then through the insulative base using laser drilling, then into but not through the metal base using wet chemical etching. As another example, the via can be formed through the metal layer using wet chemical etching, then through the insulative base using plasma etching, then into but not through the metal base using wet chemical etching.

The bumped terminal is particularly well-suited for interconnecting to the next level assembly. The bumped terminal need not necessarily extend above the insulative base, and a ball, pad or pillar (columnar post) can be subsequently deposited on the bumped terminal. likewise, the bumped terminal can be disposed within or outside the periphery of the chip. For instance, if the bumped terminal is disposed within the periphery of the chip, then the adhesive which mechanically attaches the laminated structure to the chip can fill the cavity.

The bumped terminal can be formed with numerous techniques and materials. For instance, the bumped terminal can be formed by electrolessly plating a tin layer on the metal layer, the insulative base and the metal base in the via, and then electroplating a copper layer on the tin layer. As another example, the first portion of the bumped terminal can include a tin surface layer rather than a gold surface layer. These approaches provide a tin-coated bumped terminal that is well-suited for a tin reflow operation in a lead-free environment during the next level assembly, or alternatively, a solder reflow operation during the next level assembly in which solder paste is deposited on the bumped terminal after the metal base is removed. As another example, the first portion of the bumped terminal can consist of solder. This provides a solder-coated bumped terminal that is well-suited for a solder reflow operation during the next level assembly. As another example, the first portion of the bumped terminal can consist of copper. As still another example, one or both of the masking films on the metal base and the metal layer can remain intact when the second portion of the bumped terminal is formed. If, for instance, the masking film remains on the metal layer while the second portion of the bumped terminal is formed, then the routing line will consist of an unetched portion of the metal layer.

The metal layer can be etched to form the routing line at various stages. For instance, a photoresist layer can be formed over the metal layer before or after the via is formed, and before or after the bumped terminal is formed. Similarly, the metal layer can be etched using the photoresist layer as an etch mask to form the routing line before or after the via is formed, and before or after the bumped terminal is formed. Similarly, the photoresist layer can be stripped before or after the via is formed, and before or after the bumped terminal is reflowed. Preferably, the photoresist layer is not present when the bumped terminal is formed.

The pad can have numerous shapes including a flat rectangular shape and a bumped shape. For instance, a bump-shaped pad may extend into the through-hole and may even extend above the routing line. The pad can either be partially or completely exposed prior to forming the connection joint. The pad can have a length and width that are larger than, equal to, or smaller than the diameter of the through-hole. Preferably, the pad and through-hole have the same or similar size, and a substantial portion of the pad is directly beneath the through-hole. If desired, the pad can be treated to accommodate the connection joint. For instance, the pad can be rendered catalytic to an electroless nickel connection joint by depositing several metal layers, such as chromium/copper/gold or titanium/nickel/gold on the aluminum base, or alternatively, zincating the aluminum base and electrolessly plating a nickel surface layer on the zincated aluminum base.

Numerous adhesives can be applied between the chip and the conductive trace. For instance, the adhesive can be applied as a paste, a laminated layer, or a liquid applied by screen-printing, spin-on, or spray-on. If a paste or liquid adhesive is applied, the adhesive may contact the insulative base, whereas if a laminated adhesive is applied then no appreciable amount of adhesive may contact the insulative base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Furthermore, silicone adhesives are particularly well-suited if the adhesive is used to fill the cavity.

The through-hole may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the through-hole in the insulative base and the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the through-hole in the insulative base and the adhesive.

The through-hole can be formed with numerous etching techniques. For instance, the through-hole can be formed by laser direct write (without a mask). In addition, the through-hole can have a circular, ovular, square, rectangular or other shape (as viewed from the top surface of the insulative base). The through-hole may be aligned with and expose a single pad or a plurality of pads. Furthermore, the through-hole sidewalls may have a wide variety of shapes and slopes including vertical sidewalls, tapered sidewalls, continuous sidewalls and stepped sidewalls.

The encapsulant can be deposited on the chip using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joint depends on the composition of the routing line and the bumped terminal as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

After the connection joint is formed, further encapsulation can be performed but is generally not necessary. However, it may be desirable to provide further encapsulation to enhance the mechanical strength of the assembly in the event the encapsulant and/or insulative base are particularly thin or omitted. Likewise, further encapsulation can be used to cover the connection joint.

After the connection joint is formed, a soldering material or solder ball can be deposited over the bumped terminal by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly. Moreover, the bumped terminal can be formed with a solder surface layer, thereby rendering additional soldering material unnecessary. That is, the bumped terminal itself can be reflowed to provide a solder joint for electrical connection with the next level assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted, and/or mounted on a printed circuit board. Similarly, the conductive trace is disposed "above" the chip when the bottom surface of the conductive trace faces the upper surface of the chip regardless of whether the assembly is inverted. Likewise, the routing line is shown above the chip, the insulative base is shown above the routing line, and the metal base is shown above the insulative base with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, bump grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The insulative base and the encapsulant protect the chip from handling damage and provide a known dielectric barrier for the conductive trace. The insulative base and the encapsulant also provide critical mechanical support for the conductive trace during and after the metal base removal. The insulative base prevents solder reflow from electrically shorting the underlying routing line. The bumped terminal yields enhanced reliability for the next level assembly. The mode of the connection shifts from the initial mechanical coupling to metallurgical coupling to assure sufficient metallurgical bond strength. Furthermore, the conductive trace can be mechanically and metallurgically coupled to the chip without wire bonding, TAB or solder Joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

What is claimed is:

1. A method of making a semiconductor chip assembly, comprising:
   providing a semiconductor chip and a laminated structure, wherein the chip includes a conductive pad, the laminated structure includes a conductive trace, an insulative base and a metal base, the conductive trace includes a routing line and a bumped terminal, the metal base and the routing line are disposed on opposite sides of the insulative base, and the bumped terminal includes a cavity that extends through the insulative base and into the metal base;
   removing a portion of the metal base that contacts the bumped terminal; and
   forming a connection joint that contacts and electrically connects the conductive trace and the pad.

2. The method of claim 1, including mechanically attaching the chip to the conductive trace using an insulative adhesive before removing the portion of the metal base.

3. The method of claim 2, including forming a through-hole that extends through the insulative base and the adhesive and exposes the conductive trace and the pad after removing the portion of the metal base and before forming the connection joint.

4. The method of claim 3, wherein the adhesive contacts and is sandwiched between the conductive trace and the pad, and the conductive trace and the pad are electrically isolated from one another after forming the through-hole and before forming the connection joint.

5. The method of claim 1, including filling an insulator into the cavity before removing the portion of the metal base.

6. The method of claim 1, wherein the bumped terminal extends into and contacts sidewalls of an opening in the routing line.

7. The method of claim 1, wherein the bumped terminal is a plated metal.

8. The method of claim 1, wherein the metal base and the routing line are a first metal and the bumped terminal includes a second metal.

9. The method of claim 8, wherein the first metal is copper and the second metal is nickel.

10. The method of claim 1, wherein the assembly is devoid of wire bonds and TAB leads.

11. A method of making a semiconductor chip assembly, comprising:
    providing a semiconductor chip that includes a conductive pad;
    providing a laminated structure that includes a conductive trace, an insulative base and a metal base, wherein the conductive trace includes a routing line and a bumped terminal, the metal base and the routing line are disposed on opposite sides of the insulative base, and the bumped terminal includes a cavity that extends through the insulative base and into the metal base; then
    disposing an insulative adhesive between the chip and the laminated structure, thereby mechanically attaching the chip to the laminated structure such that the metal base is disposed on a side of the insulative base that faces away from the chip and the routing line is disposed on a side of the insulative base that faces towards the chip; then
    removing a portion of the metal base that contacts the bumped terminal; and
    forming a connection joint that contacts and electrically connects the conductive trace and the pad.

12. The method of claim 11, including forming a through-hole that extends through the insulative base and the adhesive and exposes the conductive trace and the pad after removing the portion of the metal base and before forming the connection joint.

13. The method of claim 11, wherein the routing the overlaps the pad and extends within and outside a periphery of the chip, the bumped terminal is disposed outside the periphery of the chip, and the bumped terminal extends across the opposite sides of the insulative base.

14. The method of claim 11, wherein forming the bumped terminal includes:
    forming a via that extends through the insulative base and into the metal base; and then
    depositing, the bumped terminal into the via, wherein the bumped terminal in the via contacts the insulative base and the metal base.

15. The method of claim 14, wherein depositing the bumped terminal includes metal on the metal base in the via and then plating a second metal on the first metal and the insulative base in the via.

16. The method of claim 15, wherein plating the first metal includes electroplating and plating the second metal includes electroless plating.

17. The method of claim 11, wherein the adhesive fills the cavity.

18. The method of claim 11, including forming an encapsulant on the chip after attaching the chip to the laminated structure and before removing the portion of the metal base, wherein the encapsulant fills the cavity.

19. The method of claim 11, wherein the bumped terminal is the only electrical conductor that is electrically connected to the pad and extends through the insulative base to the side of the insulative base that faces away from the chip.

20. The method of claim 11, wherein the assembly is devoid of wire bonds and TAB leads.

21. A method of making a semiconductor chip assembly, comprising:
providing a laminated structure that includes a conductive trace, an insulative base and a metal base, wherein the conductive trace includes a routing line and a bumped terminal, the metal base and the routing line are disposed on opposite sides of the insulative base, and the bumped terminal includes a cavity that extends through the insulative base and into the metal base; then
disposing an insulative adhesive between a chip and the laminated structure, thereby mechanically attaching the chip to the laminated structure, wherein the chip includes a pad, the metal base is disposed on a side of the insulative base that faces away from the chip, the routing line is disposed on a side of the insulative base that faces towards the chip and extends within and outside a periphery of the chip, and the bumped terminal is disposed outside the periphery of the chip and extends through the insulative base;
removing a portion of the metal base that contacts the bumped terminal; and
forming a connection joint that contacts and electrically connects the routing line and the pad.

22. The method of claim 21, wherein forming the touting line includes:
providing a metal layer in contact with the insulative base;
forming a photoresist layer;
etching the metal layer using the photoresist layer as an etch mask; and
removing the photoresist layer.

23. The method of claim 22, wherein forming the bumped terminal includes:
forming a via that extends through the metal layer and the insulative base and into but not through the metal base; and then
depositing the bumped terminal into the via, wherein the bumped terminal in the via contacts the metal layer, the insulative base and the metal base.

24. The method of claim 23, wherein depositing the humped terminal into the via includes:
depositing a first portion of the humped terminal into the via and on the metal base without depositing the first portion of the bumped terminal on the insulative base and without depositing the first portion of the bumped terminal on the metal layer; and then
depositing a second portion of the bumped terminal into the via and on the first portion of the bumped terminal, the insulative base and the metal layer without depositing the second portion of the bumped terminal on the metal base.

25. The method of claim 24, wherein depositing the first portion of the bumped terminal includes electroplating the first portion of the bumped terminal on the metal base.

26. The method of claim 25, wherein depositing the second portion of the bumped terminal includes electrolessly plating the second portion of the bumped terminal on the first portion of the bumped terminal, the insulative base and the metal layer.

27. The method of claim 21, wherein forming the bumped terminal includes:
forming a via that extends through the insulative base and into the metal base; and then
depositing the bumped terminal into the via, wherein the bumped terminal in die via contacts the insulative base and the metal base.

28. The method of claim 27, wherein the via extends through the routine line.

29. The method of claim 27, wherein depositing the bumped terminal includes plating a first metal on the metal base in the via and then plating a second metal on the first metal and the insulative base in the via.

30. The method of claim 29, wherein plating the first metal includes electroplating and plating the second metal includes electroless plating.

31. The method of claim 21, including forming a through-hole that extends through the insulative base and the adhesive and exposes the routing line and the pad after removing the portion of the metal base and before forming the connection joint.

32. The method of claim 31, wherein forming the through-hole includes applying a laser etch that ablates the insulative base and the adhesive.

33. The method of claim 21, including forming an encapsulant on the chip after attaching the chip to the laminated structure and before removing the portion of the metal base, wherein the encapsulant fills the cavity.

34. The method of claim 33, wherein forming the encapsulant includes transfer molding.

35. The method of claim 21, wherein the adhesive fills the cavity.

36. The method of claim 21, wherein the metal base and the routing line are copper.

37. The method of claim 21, wherein the bumped terminal includes a first plated metal spaced from the cavity and a second plated metal adjacent to the cavity.

38. The method of claim 21, wherein the bumped terminal is the only electrical conductor that is electrically connected to the pad and extends through the insulative base to the side of the insulative base that faces away from the chip after forming the connection joint.

39. The method of claim 21, wherein removing the portion of the metal base includes applying a wet chemical etch that is selective of the metal base with respect to the humped terminal.

40. The method of claim 21, wherein the assembly is devoid of wire bonds and TAB leads.

41. A method of making a semiconductor chip assembly, comprising:
providing a laminated structure that includes a metal base, an insulative base and a metal layer, wherein the metal base and the metal layer are disposed on opposite sides of the insulative base;
forming a via in the laminated structure that extends through the metal layer and the insulative base and into the metal base;
depositing a humped terminal into the via, wherein the humped terminal contacts the metal base, the insulative base and the metal layer in the via, and the bumped terminal includes a cavity that extends through the metal layer and the insulative base and into the metal base;
providing an etch mask over the metal layer, wherein the etch mask includes an opening over a portion of the metal layer;
applying an etch to the portion of the metal layer through the opening in the etch mask, thereby forming a routing line that includes an unetched portion of the metal layer; then mechanically attaching a chip to the laminated structure using an insulative adhesive, wherein the chip includes a pad, a conductive trace includes the routing line and the bumped terminal, the metal base is disposed on a side of the insulative base that faces away from the chip, and the routing line is disposed on a side of the insulative base that faces towards the chip;

removing a portion of the metal base that contacts the bumped terminal, wherein the bumped terminal extends beyond the insulative base in a direction away from the chip; and forming a connection joint that contacts and electrically connects the routing line and the pad.

42. The method of claim 41, wherein forming the via includes mechanical drilling.

43. The method of claim 41, wherein depositing the bumped terminal includes plating a metal on the insulative base and the metal layer in the via.

44. The method of claim 41, wherein depositing the bumped terminal includes plating a first metal on the metal base in the via and then plating a second metal on the first metal, the insulative base and the metal layer in the via.

45. The method of claim 41, wherein providing the etch mask includes depositing a photoresist layer on the metal layer and selectively patterning the photoresist layer after depositing the bumped terminal.

46. The method of claim 41, wherein removing the portion of the metal base includes applying a wet chemical etch that is highly selective of the metal base with respect to the insulative bass and the bumped terminal and removes all of the metal base.

47. The method of claim 41, wherein the bumped terminal is disposed within a periphery of the chip, and the adhesive fills the cavity.

48. The method of claim 41, wherein the routing line extends within and outside a periphery of the chip, the bumped terminal is disposed outside the periphery of the chip, and an encapsulant contacts a side of the chip opposite the pad, the insulative base and the routing line and fills the cavity.

49. The method of claim 41, wherein the metal base and the metal layer are copper, the bumped terminal includes nickel, the insulative base includes polyimide or epoxy, and the adhesive includes polyimide or epoxy.

50. The method of claim 41, wherein the assembly is devoid of wire bonds and TAB leads.

51. A method of making a semiconductor chip assembly, comprising:

providing a laminated structure that includes a metal base, an insulative base and a metal layer, wherein the metal base and the metal layer are disposed on opposite sides of the insulative base;

forming a via in the laminated structure that extends through the insulative base and into the metal base and the metal layer, depositing a bumped terminal into the via, wherein the bumped terminal contacts the metal base, the insulative base and the metal layer in the via, and the bumped terminal includes a cavity that extends through the metal layer and the insulative base and into the metal base;

providing an etch mask over the metal layer, wherein the etch mask includes an opening over a portion of the metal layer;

applying an etch to the portion of the metal layer through the opening in the etch mask, thereby forming a routing line that includes an unetched portion of the metal layer; then mechanically attaching a chip to the laminated structure using an insulative adhesive, wherein the chip includes a pad, a conductive trace includes the routing line and the bumped terminal, the metal base is disposed on a side of the insulative base that faces away from the chip, and the routing line is disposed on a side of the insulative base that faces towards the chip; then removing a first portion of the metal base that overlaps the pad and a second portion of the metal base that contacts the bumped terminal, wherein the bumped terminal extends beyond the insulative base in a direction away from the chip;

forming a through-hole that extends through the insulative base and the adhesive and exposes the routing line and the pad; and forming a connection joint that contacts and electrically connects the routing line and the pad.

52. The method of claim 51, wherein forming the via includes mechanical drilling.

53. The method of claim 51, wherein depositing the bumped terminal includes plating a metal on the metal base, the insulative base and the metal layer in the via.

54. The method of claim 51, wherein depositing the bumped terminal includes plating a first metal on the metal base in the via and then plating a second metal on the first metal, the insulative base and the metal layer in the via.

55. The method of claim 51, wherein providing the etch mask includes depositing a photoresist layer on the metal layer and selectively patterning the photoresist layer after depositing the bumped terminal.

56. The method of claim 51, wherein removing the portions of the metal base includes applying a wet chemical etch that is highly selective of the metal base with respect to the insulative base and the bumped terminal and removes all of the metal base.

57. The method of claim 51, wherein the bumped terminal is disposed within a periphery of the chip, and the adhesive fills the cavity.

58. The method of claim 51, wherein the routing line extends within and outside a periphery of the chip, the bumped terminal is disposed outside the periphery of the chip, and an encapsulant contacts a side of the chip opposite the pad, the insulative base and the routing line and fills the cavity.

59. The method of claim 51, wherein the metal base and the metal layer are copper, the bumped terminal includes nickel, the insulative base includes polyimide or epoxy, and the adhesive includes polyimide or epoxy.

60. The method of claim 51, wherein the assembly is devoid of wire bonds and TAB leads.

61. A method of making a semiconductor chip assembly, comprising:

providing a laminated structure that includes a metal base, an insulative base and a metal layer, wherein the metal base and the metal layer are disposed on opposite sides of the insulative base;

forming a via in the laminated structure that extends through the metal layer and the insulative base and into but not through the metal base, thereby forming a recess in the metal base;

forming a bumped terminal in the via, wherein the bumped terminal contacts the metal base, the insulative base and the metal layer in the via, and the bumped terminal includes a cavity that extends through the metal layer and he insulative base and into the recess and faces away from the metal base;

forming a routing line from a first portion of the metal layer by selectively removing a second portion of the metal layer; then mechanically attaching a chip to the laminated structure using an insulative adhesive, wherein the chip includes a pad, a conductive trace includes the routing line and the bumped terminal, the metal base is disposed on a side of the insulative base that faces away from the chip, the routing line is disposed on a side of the insulative base that faces towards the chip, and the bumped terminal contacts the routing line; then removing a portion of the metal base that contacts the bumped terminal; and forming a connection joint that contacts and electrically connects the routing line and the pad.

62. The method of claim 61, wherein forming the via includes mechanically drilling through the metal layer and the insulative base and into but not through the metal base.

63. The method of claim 61, wherein forming the via includes applying a wet chemical etch to the metal layer, then applying a laser etch or plasma etch to the insulative base, and then applying a wet chemical etch to the metal base.

64. The method of claim 61, wherein forming the bumped terminal includes:

depositing a first portion of the bumped terminal into the recess and on the metal base without depositing the first portion of the bumped terminal on the metal layer; and then depositing a second portion of the bumped terminal into the via and on the first portion of the bumped terminal, the insulative base and the metal layer without depositing the second portion of the bumped terminal on the metal base.

65. The method of claim 64, wherein depositing the first portion of the bumped terminal includes electroplating the first portion of the bumped terminal into the recess and on the metal base.

66. The method of claim 65, wherein electroplating the first portion of the bumped terminal includes electroplating a first layer of the first portion of the bumped terminal into the recess and on the metal base, then electroplating a second layer of the first portion of the bumped terminal on the first layer, and then electroplating a third layer of the first portion of the bumped terminal on the second layer.

67. The method of claim 66, wherein the metal layer and the third layer have similar compositions, and the first, second and third layers have different compositions.

68. The method of claim 67, wherein the metal base and the third layer have similar compositions.

69. The method of claim 68, wherein the metal base, the metal layer and the third layer are copper, and the first and second layers are non-copper metals.

70. The method of claim 69, wherein the first layer is gold or tin, and the second layer is nickel.

71. The method of claim 69, wherein the second portion of the bumped terminal is copper.

72. The method of claim 65, wherein the first portion of the bumped terminal is solder.

73. The method of claim 72, wherein the metal layer and the second portion of the bumped terminal have similar compositions.

74. The method of claim 73, wherein the metal layer and the second portion of the bumped terminal are copper.

75. The method of claim 65, wherein depositing the second portion of the bumped terminal includes electrolessly plating a first layer of the second portion of the bumped terminal on the first portion of the bumped terminal and the insulative base and the metal layer, thereby plating sidewall portions of the via that extend through the insulative base and electrically connecting the metal base and the metal layer.

76. The method of claim 75, wherein depositing the second portion of the bumped terminal includes electroplating a second layer of the second portion of the bumped terminal on the first layer.

77. The method of claim 76, wherein the metal layer and the first and second layers are copper.

78. The method of claim 61, wherein forming the routing line includes:

forming a photoresist layer;

etching the metal layer using the photoresist layer as an etch mask; and removing the photoresist layer.

79. The method of claim 78, wherein the photoresist layer extends into the cavity.

80. The method of claim 61, wherein removing the portion of the metal base includes applying a wet chemical etch that removes all of the metal base without removing the bumped terminal.

81. The method of claim 61, wherein forming the connection joint includes plating a metal on the routing line and the pad.

82. The method of claim 61, wherein forming the connection joint includes depositing a non-solidified material on the routing line and the pad and then hardening the non-solidified material.

83. The method of claim 61, wherein the bumped terminal is disposed within a periphery of the chip, and the adhesive fills the cavity.

84. The method of claim 61, including forming an encapsulant on a side of the chip opposite the pad, the insulative base and the routing line after attaching the chip to the laminated structure and before removing the portion of the metal base, wherein the routing line extends within and outside a periphery of the chip, the bumped terminal is disposed outside the periphery of the chip, and the encapsulant fills the cavity.

85. The method of claim 84, wherein the encapsulant is compressible and permits the bumped terminal to exhibit elastic deformation in response to external pressure applied to the bumped terminal.

86. The method of claim 61, wherein the connection joint contacts a surface of the routing line that is disposed above and overlaps and faces away from the pad, and the connection joint contacts a peripheral sidewall of the routing line that is disposed above and overlaps and is orthogonal to the pad.

87. The method of claim 61, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the bumped terminal is the only electrical conductor that is electrically connected to the pad and extends through the insulative base to the side of the insulative base that faces away from the chip.

88. The method of claim 61, wherein the steps are performed in the sequence set forth.

89. The method of claim 61, wherein the metal base and the metal layer are essentially copper, the bumped terminal includes a copper layer and non-copper layer, the insulative base is primarily polyimide or epoxy, and the adhesive is primarily polyimide or epoxy.

90. The method of claim 61, wherein the assembly is devoid of wire bonds and TAB leads.

91. A method of making a semiconductor chip assembly, comprising:

providing a laminated structure that includes a metal base, an insulative base and a metal layer, wherein the metal base and the metal layer are disposed on opposite sides of the insulative base;

forming a via in the laminated structure that extends through the metal layer and the insulative base and into but not through the metal base;

forming a conductive trace that includes a routing line and a bumped terminal, wherein the routing line includes an unetched portion of the metal layer, the bumped terminal includes a plated metal that contacts the metal base and the routing line in the via, and the bumped terminal includes a cavity that extends through the metal layer and the insulative base and into the recess and faces away from the recess;

mechanically attaching a chip to the laminated structure using an insulative adhesive, wherein the chip includes a pad, the metal base is disposed on a side of the insulative base that faces away from the chip, and the routing line is disposed on a side of the insulative base that faces towards the chip;

removing a portion of the metal base that contacts the bumped terminal, wherein the bumped terminal includes an exposed protruding portion that extends beyond the insulative base in a direction away from the chip; and forming a connection joint that contacts and electrically connects the routing line and the pad.

92. The method of claim 91, wherein forming the via includes mechanically drilling through the metal layer and the insulative base and into but not through the metal base.

93. The method of claim 91, wherein forming the bumped terminal includes:

electroplating a first portion of the bumped terminal into the recess and on the metal base without depositing the first portion of the bumped terminal on the metal layer; and then electrolessly depositing a second portion of the bumped terminal into the via and on the first portion of the bumped terminal, the insulative base and the metal layer without depositing the second portion of the bumped terminal on the metal base.

94. The method of claim 91, wherein forming the routing line includes:

forming a photoresist layer that fills the cavity;

etching the metal layer using the photoresist layer as an etch mask; and removing the photoresist layer.

95. The method of claim 91, wherein the bumped terminal is disposed within a periphery of the chip, and the adhesive fills the cavity.

96. The method of claim 91, wherein the routing line extends within and outside a periphery of the chip, the bumped terminal is disposed outside the periphery of the chip, and an encapsulant contacts a side of the chip opposite the pad, the insulative base and the routing line and fills the cavity.

97. The method of claim 96, wherein the encapsulant is formed after attaching the chip to the laminated structure and before removing the portion of the metal base.

98. The method of claim 91, wherein the connection joint contacts a surface of the routing line that is disposed above and overlaps and faces away from the pad, and the connection joint contacts a peripheral sidewall of the routing line that is disposed above and overlaps and is orthogonal to the pad.

99. The method of claim 91, wherein the steps are performed in the sequence set forth.

100. The method of claim 91, wherein the assembly is devoid of wire bonds and TAB leads.

* * * * *

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 4,
Line 47, cancel the text beginning with "The method" to and ending "insulative base." in column 4, line 64.

Column 7,
Line 49, cancel the text beginning with "Second bumped" to and ending "10.5))." in column 8, line 2.

Column 8,
Line 33, insert -- is -- after "146".
Line 54, change "layer" to -- layers --.

Column 12,
Line 53, change "10, 20, 30 and 40" to -- 1O, 2O, 3O and 4O --.

Column 14,
Line 26, change "20" to -- 2O --.

Column 16
Line 48, change "reflowed" to -- formed --.

Column 19,
Line 62, change "arc" to -- are --.

Column 20,
Line 40, change "the" to -- line --.
Line 49, delete the first instance of ",".
Line 53, insert -- plating a first -- after "includes".

Column 21,
Line 6, change "." to -- : --.
Line 28, change "touting" to -- routing --.
Lines 44 and 45, change "humped" to -- bumped --.

Column 22,
Line 2, change "die" to -- the --.
Line 5, change "routine" to -- routing --.
Lines 42, 54 and 55, change "humped" to -- bumped --.

Column 23,
Line 30, change "bass" to -- base --.
Line 55, change "," to -- ; --.

UNITED STATES PATENT AND TRADEMARK OFFICE
CERTIFICATE OF CORRECTION

PATENT NO.    : 6,800,506 B1
DATED         : October 5, 2004
INVENTOR(S)   : Charles W.C. Lin et al.

It is certified that error appears in the above-identified patent and that said Letters Patent is hereby corrected as shown below:

Column 24,
Line 65, change "he" to -- the --

Column 28,
Line 38, insert the following claims:

101. A method of making a semiconductor chip assembly, comprising:
    providing a semiconductor chip and a laminated structure, wherein the chip includes a conductive pad, the laminated structure includes a conductive trace, other conductive traces, an insulative base and a metal base, the conductive trace includes a routing line and a bumped terminal, the other conductive traces include other routing lines and other bumped terminals, the metal base and the routing line are disposed on opposite sides of the insulative base, the metal base and the other routing lines are disposed on opposite sides of the insulative base, the bumped terminal includes a cavity that extends through the insulative base and into the metal base, the other bumped terminals include cavities that extend through the insulative base and into the metal base, and the metal base electrically connects the bumped terminal to the other bumped terminals; then
    removing a portion of the metal base, thereby electrically isolating the bumped terminal from the other bumped terminals; and
    forming a connection joint that contacts and electrically connects the conductive trace and the pad.

102. The method of claim 101, including mechanically attaching the chip to the conductive trace using an adhesive before removing the portion of the metal base.

103. The method of claim 102, including forming a through-hole that extends through the insulative base and the adhesive and exposes the conductive trace and the pad after mechanically attaching the chip to the conductive trace and before forming the connection joint.

104. The method of claim 103, wherein the adhesive contacts and is sandwiched between the conductive trace and the pad, and the conductive trace and the pad are electrically isolated from one another after forming the through-hole and before forming the connection joint.

105. The method of claim 101, including filling an insulator into the cavity before removing the portion of the metal base.

106. The method of claim 101, wherein the bumped terminal extends into and contacts sidewalls of an opening in the routing line.

107. The method of claim 101, wherein the bumped terminal is a plated metal.

108. The method of claim 101, wherein the metal base and the routing line are a first metal and the bumped terminal includes a second metal.

109. The method of claim 108, wherein the first metal is copper and the second metal is nickel.

UNITED STATES PATENT AND TRADEMARK OFFICE
CERTIFICATE OF CORRECTION

PATENT NO.    : 6,800,506 B1
DATED         : October 5, 2004
INVENTOR(S)   : Charles W.C. Lin et al.

It is certified that error appears in the above-identified patent and that said Letters Patent is hereby corrected as shown below:

Column 28 (cont'd),

110. The method of claim 101, wherein the assembly is devoid of wire bonds and TAB leads.

111. A method of making a semiconductor chip assembly, comprising:
providing a semiconductor chip that includes a conductive pad;
providing a laminated structure that includes a conductive trace, an insulative base and a metal base, wherein the conductive trace includes a routing line and a bumped terminal, the metal base and the routing line are disposed on opposite sides of the insulative base, and the bumped terminal includes a cavity that extends through the insulative base and into the metal base; then
disposing an adhesive between the chip and the laminated structure, thereby mechanically attaching the chip to the laminated structure such that the metal base is disposed on a side of the insulative base that faces away from the chip and the routing line is disposed on a side of the insulative base that faces towards the chip; then
removing a portion of the metal base, thereby electrically isolating the bumped terminal from other bumped terminals that extend through the insulative base; and
forming a connection joint that contacts and electrically connects the conductive trace and the pad.

112. The method of claim 111, including forming a through-hole that extends through the insulative base and the adhesive and exposes the conductive trace and the pad after mechanically attaching the chip to the laminated structure and before forming the connection joint.

113. The method of claim 111, wherein the routing line overlaps the pad and extends within and outside a periphery of the chip, the bumped terminal is disposed outside the periphery of the chip, and the bumped terminal extends across the opposite sides of the insulative base.

114. The method of claim 111, wherein forming the bumped terminal includes:
forming a via that extends through the insulative base and into the metal base; and then
depositing the bumped terminal into the via, wherein the bumped terminal in the via contacts the insulative base and the metal base.

115. The method of claim 114, wherein depositing the bumped terminal includes plating a first metal on the metal base in the via and then plating a second metal on the first metal and the insulative base in the via.

116. The method of claim 115, wherein plating the first metal includes electroplating and plating the second metal includes electroless plating.

117. The method of claim 111, wherein the adhesive fills the cavity.

118. The method of claim 111, including forming an encapsulant on the chip after attaching the chip to the laminated structure and before removing the portion of the metal base, wherein the encapsulant fills the cavity.

119. The method of claim 111, wherein the bumped terminal is the only electrical conductor

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 28 (cont'd),
that is electrically connected to the pad and extends beyond the insulative base in a direction away from the chip after removing the portion of the metal base and forming the connection joint.

120. The method of claim 111, wherein the assembly is devoid of wire bonds and TAB leads.

121. A method of making a semiconductor chip assembly, comprising:
    providing a laminated structure that includes a conductive trace, an insulative base and a metal base, wherein the conductive trace includes a routing line and a bumped terminal, the metal base and the routing line are disposed on opposite sides of the insulative base, and the bumped terminal includes a cavity that extends through the insulative base and into the metal base; then
    disposing an adhesive between a chip and the laminated structure, thereby mechanically attaching the chip to the laminated structure, wherein the chip includes a pad, the metal base is disposed on a side of the insulative base that faces away from the chip, the routing line is disposed on a side of the insulative base that faces towards the chip and extends within and outside a periphery of the chip, and the bumped terminal is disposed outside the periphery of the chip and extends through the insulative base; then
    removing a portion of the metal base that contacts the bumped terminal, thereby electrically isolating the bumped terminal from other bumped terminals that extend through the insulative base; and
    forming a connection joint that contacts and electrically connects the routing line and the pad.

122. The method of claim 121, wherein forming the routing line includes:
providing a metal layer in contact with the insulative base;
forming a photoresist layer;
etching the metal layer using the photoresist layer as an etch mask; and
removing the photoresist layer.

123. The method of claim 122, wherein forming the bumped terminal includes:
    forming a via that extends through the metal layer and the insulative base and into but not through the metal base; and then
    depositing the bumped terminal into the via, wherein the bumped terminal in the via contacts the metal layer, the insulative base and the metal base.

124. The method of claim 123, wherein depositing the bumped terminal into the via includes:
    depositing a first portion of the bumped terminal into the via and on the metal base without depositing the first portion of the bumped terminal on the insulative base and without depositing the first portion of the bumped terminal on the metal layer; and then
    depositing a second portion of the bumped terminal into the via and on the first portion of the bumped terminal, the insulative base and the metal layer without depositing the second portion of the bumped terminal on the metal base.

125. The method of claim 124, wherein depositing the first portion of the bumped terminal includes electroplating the first portion of the bumped terminal on the metal base.

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 28 (cont'd),

126. The method of claim 125, wherein depositing the second portion of the bumped terminal includes electrolessly plating the second portion of the bumped terminal on the first portion of the bumped terminal, the insulative base and the metal layer.

127. The method of claim 121, wherein forming the bumped terminal includes:
forming a via that extends through the insulative base and into the metal base; and then
depositing the bumped terminal into the via, wherein the bumped terminal in the via contacts the insulative base and the metal base.

128. The method of claim 127, wherein the via extends through the routing line.

129. The method of claim 127, wherein depositing the bumped terminal includes plating a first metal on the metal base in the via and then plating a second metal on the first metal and the insulative base in the via.

130. The method of claim 129, wherein plating the first metal includes electroplating and plating the second metal includes electroless plating.

131. The method of claim 121, including forming a through-hole that extends through the insulative base and the adhesive and exposes the routing line and the pad after mechanically attaching the chip to the laminated structure and before forming the connection joint.

132. The method of claim 131, wherein forming the through-hole includes applying a laser etch that ablates the insulative base and the adhesive.

133. The method of claim 121, including forming an encapsulant on the chip after attaching the chip to the laminated structure and before removing the portion of the metal base, wherein the encapsulant fills the cavity.

134. The method of claim 133, wherein forming the encapsulant includes transfer molding.

135. The method of claim 121, wherein the adhesive fills the cavity.

136. The method of claim 121, wherein the metal base and the routing line are copper.

137. The method of claim 121, wherein the bumped terminal includes a first plated metal spaced from the cavity and a second plated metal adjacent to the cavity.

138. The method of claim 121, wherein the bumped terminal is the only electrical conductor that is electrically connected to the pad and extends beyond the insulative base in a direction away from the chip after removing the portion of the metal base and forming the connection joint.

139. The method of claim 121, wherein removing the portion of the metal base includes applying a wet chemical etch that is selective of the metal base with respect to the bumped terminal.

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 28 (cont'd),

140. The method of claim 121, wherein the assembly is devoid of wire bonds and TAB leads.

141. A method of making a semiconductor chip assembly, comprising:
    providing a laminated structure that includes a metal base, an insulative base and a metal layer, wherein the metal base and the metal layer are disposed on opposite sides of the insulative base;
    forming a via in the laminated structure that extends through the metal layer and the insulative base and into the metal base;
    depositing a bumped terminal into the via, wherein the bumped terminal contacts the metal base, the insulative base and the metal layer in the via, and the bumped terminal includes a cavity that extends through the metal layer and the insulative base and into the metal base;
    providing an etch mask over the metal layer, wherein the etch mask includes an opening over a portion of the metal layer;
    applying an etch to the portion of the metal layer through the opening in the etch mask, thereby forming a routing line that includes an unetched portion of the metal layer; then
    mechanically attaching a chip to the laminated structure using an adhesive, wherein the chip includes a pad, a conductive trace includes the routing line and the bumped terminal, the metal base is disposed on a side of the insulative base that faces away from the chip, and the routing line is disposed on a side of the insulative base that faces towards the chip; then
    removing a portion of the metal base that contacts the bumped terminal, thereby electrically isolating the bumped terminal from other bumped terminals that extend through the insulative base, wherein the bumped terminal extends beyond the insulative base in a direction away from the chip; and
    forming a connection joint that contacts and electrically connects the routing line and the pad.

142. The method of claim 141, wherein forming the via includes mechanical drilling.

143. The method of claim 141, wherein depositing the bumped terminal includes plating a metal on the metal base, the insulative base and the metal layer in the via.

144. The method of claim 141, wherein depositing the bumped terminal includes plating a first metal on the metal base in the via and then plating a second metal on the first metal, the insulative base and the metal layer in the via.

145. The method of claim 141, wherein providing the etch mask includes depositing a photoresist layer on the metal layer and selectively patterning the photoresist layer after depositing the bumped terminal.

146. The method of claim 141, wherein removing the portion of the metal base includes applying a wet chemical etch that is highly selective of the metal base with respect to the insulative base and the bumped terminal and removes all remaining portions of the metal base that overlap the chip.

UNITED STATES PATENT AND TRADEMARK OFFICE
CERTIFICATE OF CORRECTION

| | |
|---|---|
| PATENT NO. | : 6,800,506 B1 |
| DATED | : October 5, 2004 |
| INVENTOR(S) | : Charles W.C. Lin et al. |

It is certified that error appears in the above-identified patent and that said Letters Patent is hereby corrected as shown below:

Column 28 (cont'd),

147. The method of claim 141, wherein the bumped terminal is disposed within a periphery of the chip, and the adhesive fills the cavity.

148. The method of claim 141, wherein the routing line extends within and outside a periphery of the chip, the bumped terminal is disposed outside the periphery of the chip, and an encapsulant contacts a side of the chip opposite the pad, the insulative base and the routing line and fills the cavity.

149. The method of claim 141, wherein the metal base and the metal layer are copper, the bumped terminal includes nickel, the insulative base includes polyimide or epoxy, and the adhesive includes polyimide or epoxy.

150. The method of claim 141, wherein the assembly is devoid of wire bonds and TAB leads.

151. A method of making a semiconductor chip assembly, comprising:
    providing a laminated structure that includes a metal base, an insulative base and a metal layer, wherein the metal base and the metal layer are disposed on opposite sides of the insulative base;
    forming a via in the laminated structure that extends through the insulative base and into the metal base and the metal layer;
    depositing a bumped terminal into the via, wherein the bumped terminal contacts the metal base, the insulative base and the metal layer in the via, and the bumped terminal includes a cavity that extends through the metal layer and the insulative base and into the metal base;
    providing an etch mask over the metal layer, wherein the etch mask includes an opening over a portion of the metal layer;
    applying an etch to the portion of the metal layer through the opening in the etch mask, thereby forming a routing line that includes an unetched portion of the metal layer; then
    mechanically attaching a chip to the laminated structure using an adhesive, wherein the chip includes a pad, a conductive trace includes the routing line and the bumped terminal, the metal base is disposed on a side of the insulative base that faces away from the chip, and the routing line is disposed on a side of the insulative base that faces towards the chip; then
    removing a first portion of the metal base that contacts the bumped terminal and a second portion of the metal base that contacts other bumped terminals that extend through the insulative base, thereby electrically isolating the bumped terminal from the other bumped terminals, wherein the bumped terminal extends beyond the insulative base in a direction away from the chip; then
    forming a through-hole that extends through the insulative base and the adhesive and exposes the routing line and the pad; and
    forming a connection joint that contacts and electrically connects the routing line and the pad.

152. The method of claim 151, wherein forming the via includes mechanical drilling.

153. The method of claim 151, wherein depositing the bumped terminal includes plating a metal on the metal base, the insulative base and the metal layer in the via.

UNITED STATES PATENT AND TRADEMARK OFFICE
CERTIFICATE OF CORRECTION

| | |
|---|---|
| PATENT NO. | : 6,800,506 B1 |
| DATED | : October 5, 2004 |
| INVENTOR(S) | : Charles W.C. Lin et al. |

It is certified that error appears in the above-identified patent and that said Letters Patent is hereby corrected as shown below:

Column 28 (cont'd),

154. The method of claim 151, wherein depositing the bumped terminal includes plating a first metal on the metal base in the via and then plating a second metal on the first metal, the insulative base and the metal layer in the via.

155. The method of claim 151, wherein providing the etch mask includes depositing a photoresist layer on the metal layer and selectively patterning the photoresist layer after depositing the bumped terminal.

156. The method of claim 151, wherein removing the portions of the metal base includes applying a wet chemical etch that is highly selective of the metal base with respect to the insulative base and the bumped terminal and removes all remaining portions of the metal base that overlap the chip.

157. The method of claim 151, wherein the bumped terminal is disposed within a periphery of the chip, and the adhesive fills the cavity.

158. The method of claim 151, wherein the routing line extends within and outside a periphery of the chip, the bumped terminal is disposed outside the periphery of the chip, and an encapsulant contacts a side of the chip opposite the pad, the insulative base and the routing line and fills the cavity.

159. The method of claim 151, wherein the metal base and the metal layer are copper, the bumped terminal includes nickel, the insulative base includes polyimide or epoxy, and the adhesive includes polyimide or epoxy.

160. The method of claim 151, wherein the assembly is devoid of wire bonds and TAB leads.

161. A method of making a semiconductor chip assembly, comprising:
      providing a laminated structure that includes a metal base, an insulative base and a metal layer, wherein the metal base and the metal layer are disposed on opposite sides of the insulative base;
      forming a via in the laminated structure that extends through the metal layer and the insulative base and into but not through the metal base, thereby forming a recess in the metal base;
      forming a bumped terminal in the via, wherein the bumped terminal contacts the metal base, the insulative base and the metal layer in the via, and the bumped terminal includes a cavity that extends through the metal layer and the insulative base and into the recess and faces away from the metal base;
      forming a routing line from a first portion of the metal layer by selectively removing a second portion of the metal layer; then
      mechanically attaching a chip to the laminated structure using an adhesive, wherein the chip includes a pad, a conductive trace includes the routing line and the bumped terminal, the metal base is disposed on a side of the insulative base that faces away from the chip, the routing line is disposed on a side of the insulative base that faces towards the chip, and the bumped terminal contacts the routing line; then

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 28 (cont'd), removing a portion of the metal base that contacts the bumped terminal, thereby electrically isolating the bumped terminal from other bumped terminals that extend through the insulative base; and forming a connection joint that contacts and electrically connects the routing line and the pad.

162. The method of claim 161, wherein forming the via includes mechanically drilling through the metal layer and the insulative base and into but not through the metal base.

163. The method of claim 161, wherein forming the via includes applying a wet chemical etch to the metal layer, then applying a laser etch or plasma etch to the insulative base, and then applying a wet chemical etch to the metal base.

164. The method of claim 161, wherein forming the bumped terminal includes:
depositing a first portion of the bumped terminal into the recess and on the metal base without depositing the first portion of the bumped terminal on the metal layer; and then
depositing a second portion of the bumped terminal into the via and on the first portion of the bumped terminal, the insulative base and the metal layer without depositing the second portion of the bumped terminal on the metal base.

165. The method of claim 164, wherein depositing the first portion of the bumped terminal includes electroplating the first portion of the bumped terminal into the recess and on the metal base.

166. The method of claim 165, wherein electroplating the first portion of the bumped terminal includes electroplating a first layer of the first portion of the bumped terminal into the recess and on the metal base, then electroplating a second layer of the first portion of the bumped terminal on the first layer, and then electroplating a third layer of the first portion of the bumped terminal on the second layer.

167. The method of claim 166, wherein the metal layer and the third layer have similar compositions, and the first, second and third layers have different compositions.

168. The method of claim 167, wherein the metal base and the third layer have similar compositions.

169. The method of claim 168, wherein the metal base, the metal layer and the third layer are copper, and the first and second layers are non-copper metals.

170. The method of claim 169, wherein the first layer is gold or tin, and the second layer is nickel.

171. The method of claim 169, wherein the second portion of the bumped terminal is copper.

172. The method of claim 165, wherein the first portion of the bumped terminal is solder.

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 28 (cont'd),

173. The method of claim 172, wherein the metal layer and the second portion of the bumped terminal have similar compositions.

174. The method of claim 173, wherein the metal layer and the second portion of the bumped terminal are copper.

175. The method of claim 165, wherein depositing the second portion of the bumped terminal includes electrolessly plating a first layer of the second portion of the bumped terminal on the first portion of the bumped terminal and the insulative base and the metal layer, thereby plating sidewall portions of the via that extend through the insulative base and electrically connecting the metal base and the metal layer.

176. The method of claim 175, wherein depositing the second portion of the bumped terminal includes electroplating a second layer of the second portion of the bumped terminal on the first layer.

177. The method of claim 176, wherein the metal layer and the first and second layers are copper.

178. The method of claim 161, wherein forming the routing line includes:
forming a photoresist layer;
etching the metal layer using the photoresist layer as an etch mask; and
removing the photoresist layer.

179. The method of claim 178, wherein the photoresist layer extends into the cavity.

180. The method of claim 161, wherein removing the portion of the metal base includes applying a wet chemical etch that removes all remaining portions of the metal base that overlap the chip without removing the bumped terminal.

181. The method of claim 161, wherein forming the connection joint includes plating a metal on the routing line and the pad.

182. The method of claim 161, wherein forming the connection joint includes depositing a non-solidified material on the routing line and the pad and then hardening the non-solidified material.

183. The method of claim 161, wherein the bumped terminal is disposed within a periphery of the chip, and the adhesive fills the cavity.

184. The method of claim 161, including forming an encapsulant on a side of the chip opposite the pad, the insulative base and the routing line after attaching the chip to the laminated structure and before removing the portion of the metal base, wherein the routing line extends within and outside a periphery of the chip, the bumped terminal is disposed outside the periphery of the chip, and the encapsulant fills the cavity.

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 28 (cont'd),

185. The method of claim 184, wherein the encapsulant is compressible and permits the bumped terminal to exhibit elastic deformation in response to external pressure applied to the bumped terminal.

186. The method of claim 161, wherein the connection joint contacts a surface of the routing line that is disposed above and overlaps and faces away from the pad.

187. The method of claim 161, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the bumped terminal is the only electrical conductor that is electrically connected to the pad and extends beyond the insulative base in a direction away from the chip after removing the portion of the metal base.

188. The method of claim 161, wherein the steps are performed in the sequence set forth.

189. The method of claim 161, wherein the metal base and the metal layer are essentially copper, the bumped terminal includes a copper layer and non-copper layer, the insulative base is primarily polyimide or epoxy, and the adhesive is primarily polyimide or epoxy.

190. The method of claim 161, wherein the assembly is devoid of wire bonds and TAB leads.

191. A method of making a semiconductor chip assembly, comprising:
providing a laminated structure that includes a metal base, an insulative base and a metal layer, wherein the metal base and the metal layer are disposed on opposite sides of the insulative base;
forming a via in the laminated structure that extends through the metal layer and the insulative base and into but not through the metal base;
forming a conductive trace that includes a routing line and a bumped terminal, wherein the routing line includes an unetched portion of the metal layer, the bumped terminal includes a plated metal that contacts the metal base and the routing line in the via, and the bumped terminal includes a cavity that extends through the metal layer and the insulative base and into the recess and faces away from the recess;
mechanically attaching a chip to the laminated structure using an adhesive, wherein the chip includes a pad, the metal base is disposed on a side of the insulative base that faces away from the chip, and the routing line is disposed on a side of the insulative base that faces towards the chip; then
removing a portion of the metal base that contacts the bumped terminal, thereby electrically isolating the bumped terminal from other bumped terminals that extend through the insulative base, wherein the bumped terminal includes an exposed protruding portion that extends beyond the insulative base in a direction away from the chip; and
forming a connection joint that contacts and electrically connects the routing line and the pad.

192. The method of claim 191, wherein forming the via includes mechanically drilling

UNITED STATES PATENT AND TRADEMARK OFFICE
CERTIFICATE OF CORRECTION

PATENT NO. : 6,800,506 B1
DATED : October 5, 2004
INVENTOR(S) : Charles W.C. Lin et al.

It is certified that error appears in the above-identified patent and that said Letters Patent is hereby corrected as shown below:

Column 28 (cont'd), through the metal layer and the insulative base and into but not through the metal base.

193. The method of claim 191, wherein forming the bumped terminal includes:
electroplating a first portion of the bumped terminal into the recess and on the metal base without depositing the first portion of the bumped terminal on the metal layer; and then
electrolessly depositing a second portion of the bumped terminal into the via and on the first portion of the bumped terminal, the insulative base and the metal layer without depositing the second portion of the bumped terminal on the metal base.

194. The method of claim 191, wherein forming the routing line includes:
forming a photoresist layer that fills the cavity;
etching the metal layer using the photoresist layer as an etch mask; and
removing the photoresist layer.

195. The method of claim 191, wherein the bumped terminal is disposed within a periphery of the chip, and the adhesive fills the cavity.

196. The method of claim 191, wherein the routing line extends within and outside a periphery of the chip, the bumped terminal is disposed outside the periphery of the chip, and an encapsulant contacts a side of the chip opposite the pad, the insulative base and the routing line and fills the cavity.

197. The method of claim 196, wherein the encapsulant is formed after attaching the chip to the laminated structure and before removing the portion of the metal base.

198. The method of claim 191, wherein the connection joint contacts a surface of the routing line that is disposed above and overlaps and faces away from the pad, and the connection joint contacts a peripheral sidewall of the routing line that is disposed above and overlaps and is orthogonal to the pad.

199. The method of claim 191, wherein the steps are performed in the sequence set forth.

200. The method of claim 191, wherein the assembly is devoid of wire bonds and TAB leads.

Signed and Sealed this

Seventh Day of June, 2005

JON W. DUDAS
*Director of the United States Patent and Trademark Office*